United States Patent
Shirakami

(10) Patent No.: US 12,062,937 B2
(45) Date of Patent: Aug. 13, 2024

(54) METHOD OF CONTROLLING SECONDARY BATTERY AND BATTERY SYSTEM

(71) Applicant: Panasonic Intellectual Property Management Co., Ltd., Osaka (JP)

(72) Inventor: Atsuro Shirakami, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 472 days.

(21) Appl. No.: 17/021,562

(22) Filed: Sep. 15, 2020

(65) Prior Publication Data

US 2022/0085634 A1  Mar. 17, 2022

(51) Int. Cl.

| | | |
|---|---|---|
| *H02J 7/00* | (2006.01) | |
| *H01M 10/0525* | (2010.01) | |
| *H01M 10/44* | (2006.01) | |
| *H01M 10/48* | (2006.01) | |
| *G01R 31/389* | (2019.01) | |
| *H01M 4/38* | (2006.01) | |
| *H01M 10/052* | (2010.01) | |

(52) U.S. Cl.
CPC ..... *H02J 7/00712* (2020.01); *H01M 10/0525* (2013.01); *H01M 10/44* (2013.01); *H01M 10/48* (2013.01); *H02J 7/007194* (2020.01); *G01R 31/389* (2019.01); *H01M 4/382* (2013.01); *H01M 10/052* (2013.01)

(58) Field of Classification Search
CPC .......... H02J 7/00712; H02J 7/007194; H01M 10/0525; H01M 10/44; H01M 10/48
USPC ....................................... 320/129
See application file for complete search history.

(56) References Cited

U.S. PATENT DOCUMENTS

| | | | | |
|---|---|---|---|---|
| 4,786,985 A | * | 11/1988 | Williams | G11B 27/3054 |
| | | | | 386/221 |
| 6,081,097 A | * | 6/2000 | Seri | H02J 7/00712 |
| | | | | 320/132 |
| 6,232,748 B1 | * | 5/2001 | Kinoshita | B60W 10/26 |
| | | | | 903/917 |
| 6,714,882 B1 | * | 3/2004 | Iwaizono | H02J 7/0031 |
| | | | | 702/136 |
| 6,721,080 B1 | * | 4/2004 | Tench | G02F 1/1506 |
| | | | | 359/267 |
| 6,925,400 B2 | * | 8/2005 | Iwaizono | H02J 7/00302 |
| | | | | 702/136 |

(Continued)

FOREIGN PATENT DOCUMENTS

| | | | |
|---|---|---|---|
| DE | 102019129079 B3 | * | 2/2021 |
| JP | H07065867 A | * | 3/1995 |

(Continued)

OTHER PUBLICATIONS

EIC-STIC 2800 search report, Eileen Patton, completed Nov. 28, 2022 (Year: 2022).*

*Primary Examiner* — John T Trischler
(74) *Attorney, Agent, or Firm* — WHDA, LLP

(57) ABSTRACT

A control method includes determining whether an internal resistance of a secondary battery is higher than a first threshold resistance, performing first discharge of the secondary battery if it is determined that the internal resistance is higher than the first threshold resistance, and performing at least one of a charge operation of the secondary battery and a discharge operation of the secondary battery after the first discharge is performed.

18 Claims, 21 Drawing Sheets

(56) References Cited

U.S. PATENT DOCUMENTS

| | | | |
|---|---|---|---|
| 6,987,377 B2* | 1/2006 | Sakakibara | G01R 31/389 320/132 |
| 7,362,074 B2* | 4/2008 | Iwane | G01R 31/392 320/132 |
| 7,502,700 B2* | 3/2009 | Iwaizono | H02J 7/007194 320/134 |
| 7,616,003 B2* | 11/2009 | Satoh | G01R 31/389 324/426 |
| 7,688,033 B2* | 3/2010 | Minamiura | H02J 7/0047 320/136 |
| 8,143,741 B2* | 3/2012 | Funakoshi | B60L 1/14 315/307 |
| 8,470,470 B2* | 6/2013 | Okumura | H01M 10/4207 429/90 |
| 8,581,555 B2* | 11/2013 | Yamamoto | H01M 10/44 320/128 |
| 8,854,009 B2* | 10/2014 | Benise | H02J 7/007194 320/135 |
| 9,140,761 B2* | 9/2015 | Ishishita | G01R 31/396 |
| 9,145,059 B2* | 9/2015 | Gibbs | B60L 58/16 |
| 9,575,131 B2* | 2/2017 | Okumura | G01R 31/367 |
| 9,753,094 B2* | 9/2017 | Thompson | H02J 7/00041 |
| 10,084,330 B2* | 9/2018 | Toya | H01M 10/44 |
| 10,162,014 B2* | 12/2018 | Iida | G01R 31/3648 |
| 10,277,051 B2* | 4/2019 | Liang | H02J 7/04 |
| 10,283,820 B2* | 5/2019 | Sugeno | H02J 7/0029 |
| 10,734,688 B2* | 8/2020 | Chae | H02J 7/0013 |
| 10,847,982 B2* | 11/2020 | Adachi | G01R 31/387 |
| 11,241,599 B2* | 2/2022 | Enk | A62C 37/04 |
| 11,251,473 B2* | 2/2022 | Machida | H02J 7/0013 |
| 11,362,322 B2* | 6/2022 | Suzuki | H01M 10/0567 |
| 11,397,215 B2* | 7/2022 | Ghantous | H02J 7/0047 |
| 11,397,216 B2* | 7/2022 | Ghantous | H02J 7/007182 |
| 2004/0012373 A1* | 1/2004 | Sakakibara | H02J 7/0049 320/132 |
| 2004/0061919 A1* | 4/2004 | Tench | G02F 1/1506 359/265 |
| 2004/0162698 A1* | 8/2004 | Iwaizono | H02J 7/007194 702/132 |
| 2004/0167741 A1* | 8/2004 | Iwaizono | H02J 7/007194 702/132 |
| 2005/0123834 A1* | 6/2005 | Noguchi | H01M 10/0569 429/223 |
| 2006/0066285 A1* | 3/2006 | Minamiura | H02J 7/0047 320/132 |
| 2006/0186890 A1* | 8/2006 | Iwane | G01R 31/392 324/426 |
| 2007/0252601 A1* | 11/2007 | Satoh | G01R 31/389 324/430 |
| 2009/0004569 A1* | 1/2009 | Yamamoto | C01B 32/20 427/215 |
| 2009/0243489 A1* | 10/2009 | Funakoshi | B60L 1/14 315/78 |
| 2010/0047684 A1* | 2/2010 | Okumura | H01M 10/42 429/156 |
| 2011/0187312 A1* | 8/2011 | Yamamoto | H01M 10/44 320/101 |
| 2011/0312391 A1* | 12/2011 | Benise | H02J 7/00302 455/572 |
| 2012/0004875 A1* | 1/2012 | Maeda | H01M 10/48 702/63 |
| 2012/0081077 A1* | 4/2012 | Sasaki | H01M 10/482 320/134 |
| 2012/0185190 A1* | 7/2012 | Okumura | G01R 31/367 702/63 |
| 2012/0262180 A1* | 10/2012 | Ishishita | G01R 31/3842 324/430 |
| 2013/0063094 A1* | 3/2013 | Gibbs | B60L 58/16 320/134 |
| 2015/0295448 A1* | 10/2015 | Sugeno | B60L 58/21 320/136 |
| 2015/0349558 A1* | 12/2015 | Toya | H02J 5/00 320/110 |
| 2016/0097820 A1* | 4/2016 | Thompson | G01R 31/374 320/134 |
| 2016/0204639 A1* | 7/2016 | Honkura | H02J 7/0068 429/50 |
| 2017/0160349 A1* | 6/2017 | Iida | H02J 7/005 |
| 2017/0207497 A1* | 7/2017 | Chae | H01M 10/44 |
| 2017/0324096 A1* | 11/2017 | Korchev | H01M 4/525 |
| 2018/0115024 A1* | 4/2018 | Sugeno | H02J 7/35 |
| 2018/0123371 A1* | 5/2018 | Liang | H02J 7/007 |
| 2019/0072618 A1* | 3/2019 | Ghantous | H02J 7/005 |
| 2019/0120910 A1* | 4/2019 | Ghantous | H02J 7/0047 |
| 2019/0165586 A1* | 5/2019 | Adachi | H02J 7/0029 |
| 2019/0181657 A1* | 6/2019 | Deshpande | H02J 7/00306 |
| 2019/0344109 A1* | 11/2019 | Enk | A62C 37/04 |
| 2019/0379035 A1* | 12/2019 | Suzuki | H01M 10/052 |
| 2020/0303787 A1* | 9/2020 | Machida | H01M 10/441 |
| 2020/0321795 A1* | 10/2020 | Nagano | H02J 7/005 |
| 2021/0148987 A1* | 5/2021 | Ghantous | H01M 10/44 |
| 2022/0317198 A1* | 10/2022 | Ghantous | H02J 7/0047 |
| 2022/0317199 A1* | 10/2022 | Ghantous | H02J 7/00711 |
| 2023/0006271 A1* | 1/2023 | Ghantous | H02J 7/0047 |
| 2023/0029405 A1* | 1/2023 | Stefanopoulou | H01M 10/058 |
| 2023/0059104 A1* | 2/2023 | Schreiber | H01M 50/249 |
| 2023/0198033 A1* | 6/2023 | Hirowatari | H01M 10/484 320/134 |

FOREIGN PATENT DOCUMENTS

| | | | | |
|---|---|---|---|---|
| JP | H0864255 A | * | 3/1996 | |
| JP | 9-326252 A | | 12/1997 | |
| JP | 2001-243957 A | | 9/2001 | |
| JP | 3217456 B2 | * | 10/2001 | H01M 10/0569 |
| JP | 3346613 B2 | * | 11/2002 | |
| JP | 2004271445 A | * | 9/2004 | G01R 31/389 |
| JP | 3699494 B2 | * | 9/2005 | |
| JP | 2009154581 A | * | 7/2009 | |
| JP | 2013-069659 A | | 4/2013 | |
| JP | 2013125713 A | * | 6/2013 | |
| JP | 2014157662 A | * | 8/2014 | |
| JP | 2019204646 A | * | 11/2019 | |
| WO | WO-2014027389 A1 | * | 2/2014 | B60L 1/003 |

* cited by examiner

METHOD OF CONTROLLING SECONDARY BATTERY AND BATTERY SYSTEM

CROSS REFERENCE TO RELATED APPLICATIONS

The present application relates to Japanese Patent Application No. 2018-098220 filed with the Japan Patent Office on May 22, 2018, the entire contents of which are incorporated herein by reference.

BACKGROUND OF THE INVENTION

Field of the Invention

The present disclosure relates to a method of controlling a secondary battery and a battery system.

Description of Related Art

Non-aqueous electrolyte secondary batteries are used for information communication technology (ICT) applications including a personal computer and a smartphone. The non-aqueous electrolyte secondary batteries are also used for in-vehicle applications and power storage applications. The non-aqueous electrolyte secondary batteries are used in a wide range of applications, as described above.

The non-aqueous electrolyte secondary batteries are required to further increase their capacities. Lithium ion batteries are known as the high-capacity non-aqueous electrolyte secondary batteries. Both an alloy active material, such as a silicon compound, and graphite are used as a negative electrode active material of the lithium ion battery. This may achieve the high capacity of the lithium ion battery. However, the increase in the capacity of the lithium ion battery is reaching the limit.

Secondary batteries in which lithium metal is precipitated into a negative electrode during charge are also known as the non-aqueous electrolyte secondary batteries. Such a secondary battery may be hereinafter referred to as a lithium secondary battery. In terms of the high capacity, the lithium secondary battery is more promising than the lithium ion battery. In the lithium secondary battery, the lithium metal is dissolved into the non-aqueous electrolyte during discharge.

An example of the lithium secondary battery is described in Japanese Published Unexamined Patent Application No. 2001-243957 (Patent Document 1).

There is room for improvement on the technologies in related art in terms of a discharge operation and/or a charge operation of the lithium secondary battery in a state in which the internal resistance of the lithium secondary battery is sufficiently decreased.

BRIEF SUMMARY OF THE INVENTION

According to an embodiment of the present disclosure, a control method for a secondary battery which includes a positive electrode and a negative electrode and in which lithium metal is precipitated into the negative electrode during charge of the secondary battery includes determining whether an internal resistance of the secondary battery is higher than a first threshold resistance; performing first discharge of the secondary battery if it is determined that the internal resistance is higher than the first threshold resistance; and performing at least one of a charge operation of the secondary battery and a discharge operation of the secondary battery after the first discharge is performed.

With the technology according to the present disclosure, it is possible to perform the discharge operation and/or the charge operation of the secondary battery in a state in which the internal resistance of the secondary battery is sufficiently decreased.

DETAILED DESCRIPTION OF THE INVENTION

Underlying Finding of Present Disclosure

Figure 1:
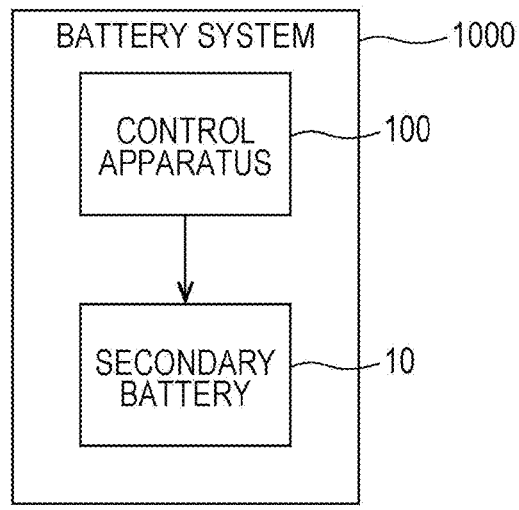
FIG. 1 is a block diagram illustrating an example of the schematic configuration of a battery system in a first embodiment.

A solid electrolyte interphase (SEI) film may be formed on the negative electrode of a lithium secondary battery. The formation of the SEI film on the negative electrode temporarily increases the internal resistance of the lithium secondary battery. However, the state in which the internal resistance is temporarily increased is capable of being relieved or cleared through discharge of the lithium secondary battery. The inventor has supposed that the discharge is performed before a charge operation and/or a discharge operation. This enables the discharge operation and/or the charge operation of the lithium secondary battery to be performed in a state in which the temporarily increased internal resistance is sufficiently decreased. The present disclosure is based on such a finding of the inventor.

Summary of Aspects According to Present Disclosure

A control method for a secondary battery which includes a positive electrode and a negative electrode and in which lithium metal is precipitated into the negative electrode during charge of the secondary battery according to a first aspect of the present disclosure includes determining whether an internal resistance of the secondary battery is higher than a first threshold resistance; performing first discharge of the secondary battery if it is determined that the internal resistance is higher than the first threshold resistance; and performing at least one of a charge operation of the secondary battery and a discharge operation of the secondary battery after the first discharge is performed.

Through the determination of the first aspect, the state in which the internal resistance of the secondary battery is temporarily increased is capable of being detected. Through the first discharge of the first aspect, the state is capable of being relieved or cleared. In the first aspect, at least one of the charge operation and the discharge operation is performed after the first discharge. Accordingly, according to the first aspect, it is possible to perform the discharge operation and/or the charge operation of the secondary battery in the state in which the internal resistance is sufficiently decreased.

In a second aspect of the present disclosure, for example, in the control method according to the first aspect, a capacity that is higher than 0% of the capacity of the positive electrode and that is not higher than 25% thereof is discharged from the secondary battery through the first discharge.

Limiting the capacity discharged through the first discharge to the range defined in the second aspect is appropriate to realize the first discharge capable of sufficiently decreasing the internal resistance for a short time.

In a third aspect of the present disclosure, for example, the control method according to the first aspect or the second aspect includes sequentially performing the first discharge of the secondary battery and first charge of the secondary battery if it is determined that the internal resistance is higher than the first threshold resistance and performing at least one of second charge as the charge operation and second discharge as the discharge operation after the first discharge and the first charge are performed. The second charge is charge with charge current larger than that of the first charge, and the second discharge is discharge with discharge current larger than that of the first discharge.

High-current charge is capable of being performed as the second charge of the third aspect. High-current discharge is capable of being performed as the second discharge of the third aspect. In the third aspect, the first discharge is performed before the second charge and/or the second discharge. Accordingly, according to the third aspect, it is possible to perform the high-current charge and/or the high-current discharge in the state in which the internal resistance is sufficiently decreased.

In a fourth aspect of the present disclosure, for example, the control method according to any of the first to third aspects is performed using a control apparatus. The control apparatus is configured so as to perform third charge of the secondary battery and second charge of the secondary battery in which the secondary battery is charged with charge current larger than that of the third charge. The control method includes determining whether the internal resistance is higher than a second threshold resistance after the first discharge is performed, performing the third charge as the charge operation if it is determined that the internal resistance is higher than the second threshold resistance, and performing the second charge as the charge operation if it is determined that the internal resistance is not higher than the second threshold resistance.

According to the fourth aspect, the third charge is capable of being performed if the internal resistance is high. Accordingly, a situation is capable of being avoided, in which formation of dendrite is promoted because of the high internal resistance and the large charge current when the internal resistance is high. According to the fourth aspect, the second charge is capable of being performed if the internal resistance is low. Accordingly, the secondary battery is capable of being rapidly charged through the high-current charge in a situation in which the formation of the dendrite can be suppressed because of the low inter al resistance.

In a fifth aspect of the present disclosure, for example, the control method according to any of the first to fourth aspects is performed using a control apparatus. The control apparatus is configured so as to perform third discharge of the secondary battery and second discharge of the secondary battery in which discharge current larger than that of the third discharge is discharged from the secondary battery. The control method includes determining whether the internal resistance is higher than a second threshold resistance after the first discharge is performed, performing the third discharge as the discharge operation if it is determined that the internal resistance is higher than the second threshold resistance, and performing the second discharge as the discharge operation if it is determined that the internal resistance is not higher than the second threshold resistance.

According to the fifth aspect, the third discharge is, capable of being performed if the internal resistance is high. Accordingly, it is possible to avoid an occurrence of a problem caused by the high-current discharge that is performed when the internal resistance is high. Specifically, the voltage of the battery is decreased in the discharge by a value resulting from multiplication of the internal resistance by the current value. If the high-current discharge is performed when the internal resistance is high and the voltage of the battery exceeds the lower limit of the voltage at which the system is operable, the system may be abnormally stopped. In addition, such a reduction in the voltage of the battery during discharge may greatly decrease the output from the battery. However, according to the fifth aspect, it is possible to avoid an occurrence of such a problem. According to the fifth aspect, the second discharge is capable of being performed if the internal resistance is low. Accordingly, the secondary battery is capable of being, rapidly discharged through the high-current discharge in a situation in which the above problem is less likely to occur because of the low internal resistance.

In a sixth aspect of the present disclosure, for example, the control method according to any of the first to fifth aspects includes sequentially performing the first discharge of the secondary battery and first charge of the secondary battery if it is determined that the internal resistance is higher than the first threshold resistance; performing at least one of the charge operation and the discharge operation after the first discharge and the first charge are performed; and not performing the first discharge and the first charge and performing at least one of second charge of the secondary battery and second discharge of the secondary battery if it is determined that the internal resistance is not higher than the first threshold resistance. The second charge is charge with charge current larger than that of the first charge, and the second discharge is discharge with discharge current larger than that of the first discharge.

In a seventh aspect of the present disclosure, for example, the control method according to any of the first to sixth aspects is performed using a control apparatus. The control apparatus is configured so as to perform third charge of the secondary battery and second charge of the secondary battery in which the secondary battery is charged with charge current larger than that of the third charge. The control method does not perform the first discharge and performs the second charge if it is determined that the internal resistance is not higher than the first threshold resistance.

In an eighth aspect of the present disclosure, for example, the control method according to any of the first to seventh aspects is performed using a control apparatus. The control apparatus is configured so as to perform third discharge of the secondary battery and second discharge of the secondary battery in which discharge current larger than that of the third discharge is discharged from the secondary battery. The control method does not perform the first discharge and performs the second discharge if it is determined that the internal resistance is not higher than the first threshold resistance.

The high-current charge is capable of being performed as the second charge of the sixth aspect and the seventh aspect. According to the sixth aspect and the seventh aspect, it is possible to rapidly charge the secondary battery through the high-current charge in the situation in which the formation of the dendrite can be suppressed because of the low internal resistance. The high-current discharge is capable of being performed as the second discharge of the sixth aspect and the eight aspect. According to the sixth aspect and the eighth aspect, it is possible to produce large output from the secondary battery through the high-current discharge in the situation in which the above problem is less likely to occur because of the low internal resistance.

In a ninth aspect of the present disclosure, for example, in the control method according to any of the first to eighth aspects, it is determined that the internal resistance is higher than the first threshold resistance if a calculated value of the internal resistance is higher than the first threshold resistance. The calculated value is calculated from detection data about the secondary battery. The detection data includes at least one of a detection value of voltage of the secondary battery and a detection value of current of the secondary battery.

According to the ninth aspect, it is possible to accurately calculate the internal resistance of the secondary battery.

In a tenth aspect of the present disclosure, for example, the control method according to the ninth aspect is performed using a control apparatus. The control apparatus is configured so as to perform pulse energization, which is pulse discharge or pulse charge of the secondary battery. Closed circuit voltage, which is the voltage of the secondary battery during the pulse energization, the current of the secondary battery during the pulse energization, and open circuit voltage, which is the voltage of the secondary battery during non-energization before the pulse energization is performed, are used for the calculation of the calculated value.

According to the tenth aspect, it is possible to particularly accurately calculate the internal resistance of the secondary battery.

In an eleventh aspect of the present disclosure, for example, in the control method according to any of the first to tenth aspects, the first discharge is performed also if a temperature of the secondary battery is higher than a threshold temperature.

According to the review by the inventor, the temporary increase in the internal resistance of the secondary battery is gradually increased during a period in which the energization of the secondary battery is not performed. When the temperature of the secondary battery is high, the temporary increase is rapidly increased. Accordingly, the temporary increase may reach a significant extent when the temperature of the secondary battery is high. In order to resolve this problem, in the eleventh aspect, the first discharge is performed when the temperature of the secondary battery is high. This enables the discharge operation and/or the charge operation of the secondary battery to be avoided in the state in which the internal resistance of the secondary battery is temporarily increased.

In a twelfth aspect of the present disclosure, for example, in the control method according to any of the first to eleventh aspects, the first discharge is performed also if a count time is longer than a threshold time. The count time is a duration from the last time when the genergization of the secondary battery is terminated or a time later than the last time when the energization of the secondary battery is terminated, and the last time when the energization of the secondary battery is terminated indicates the later time, among the last time when the discharge of the secondary battery is terminated and the last time when the charge of the secondary battery is terminated.

The temporary increase in the internal resistance of the secondary battery may reach a significant extent when the count time is long. In order to resolve this problem, in the twelfth aspect, the first discharge is performed when the count time is long. This enables the discharge operation and/or the charge operation of the secondary battery to be avoided in the state in which the internal resistance of the secondary battery is temporarily increased.

In a thirteenth aspect of the present disclosure, for example, in the control method according to the twelfth aspect, the first discharge is performed also if a recording value that indicates the count time and that should be recorded is not recorded in a recording unit.

When the recording value indicating the count time is not recorded, the count time is unknown. In this case, the count time may be long and the temporary increase in the internal resistance of the secondary battery may reach a significant extent. In order to resolve this problem, in the thirteenth aspect, the first discharge is performed when the recording value indicating the count time is not recorded. This enables the discharge operation and/or the charge operation of the secondary battery to be avoided in the state in which the internal resistance of the secondary battery is temporarily increased.

In a fourteenth aspect of the present disclosure, for example, in the control method according to any of the first to thirteenth aspects, the capacity of the lithium metal remaining on a surface of the negative electrode in a full discharge state of the secondary battery is 0% or more and 200% or less of the capacity of the positive electrode.

The secondary battery of the fourteenth aspect is a specific example of the secondary battery to which the technology according to the present disclosure is applicable.

In a fifteenth aspect of the present disclosure, for example, the control method according to any of the first to fourteenth aspects includes sequentially performing the first discharge of the secondary battery and first charge of the secondary battery if it is determined that the internal resistance is higher than the first threshold resistance. The capacity charged in the secondary battery through the first charge is higher than zero and lower than twice the capacity discharged from the secondary battery through the first discharge.

The first charge may decrease the capacity remaining in the battery to decrease the voltage of the secondary. If the amount of charge is excessively decreased through the first discharge, the resistance of the positive electrode may be mainly increased to increase the internal resistance of the secondary battery. However, through the first charge of the fifteenth aspect, the discharge operation and/or the charge operation of the secondary battery is capable of being performed in a state in which the decrease in the voltage of the battery and/or or the increase in the internal resistance is suppressed.

In a sixteenth aspect of the present disclosure, for example, in the control method according to any of the first to fifteenth aspects, when the first discharge and the charge operation are performed, the capacity discharged from the secondary battery through the first discharge is lower than the capacity charged into the secondary battery in the charge operation. When the first discharge and the discharge operation are performed, the capacity discharged from the secondary battery through the first discharge is lower than the capacity discharged from the secondary battery in the discharge operation.

According to the sixteenth aspect, it is possible to prevent excessive emission of the energy of the secondary battery through the first discharge.

A control method for a secondary battery which includes a positive electrode and a negative electrode and in which lithium metal is precipitated into the negative electrode during charge of the secondary battery according to a seventeenth aspect of the present disclosure includes relieving or clearing a temporary increase in internal resistance of the secondary battery through first discharge of the secondary battery and performing at least one of a charge operation of the secondary battery and a discharge operation of the secondary battery after the first discharge is performed.

Through the first discharge of the seventeenth aspect, it is possible to perform the discharge operation and/or the charge operation of the secondary battery in the state in which the internal resistance is sufficiently decreased.

A battery system according to an eighteenth aspect of the present disclosure includes a secondary battery including a positive electrode and a negative electrode and a control apparatus performing the control method according to any of the first to seventeenth aspects.

According to the battery system of the eighteenth aspect, it is possible to perform the discharge operation and/or the charge operation of the secondary batters in the state in the internal resistance is sufficiently decreased.

Embodiments of the present disclosure will herein be described with reference to the drawings. The present disclosure is not limited by the embodiments.

Ordinal numbers including the first, the second, the third, . . . may be used in the specification. When an ordinal number is added to a certain element, elements of the same type, which have smaller ordinal numbers, may not necessarily exist. For example, a term of second charge is not used to mean that first charge exists with the second charge.

A term of state of charge (SOC) may be used in the specification. The SOC is an index indicating the charge state of a battery. The SOC means the amount of charge with respect to a positive electrode capacity in the specification.

A term of a solid electrolyte interphase (SE) film may be used in the specification. The SEI film is a film formed of a decomposition product of the component of non-aqueous electrolyte.

A secondary battery in which lithium metal is precipitated into a negative electrode during charge may be referred to as a lithium secondary battery in the specification. The lithium ion battery is not included in the lithium secondary battery in the specification.

First Embodiment

FIG. 1 is a block diagram illustrating an example of a battery system in a first embodiment. In the example in FIG. 1, a battery system 1000 includes, a secondary battery 10 and a control apparatus 100.

The secondary battery 10 includes a positive electrode and a negative electrode. In the secondary battery 10, the lithium metal is precipitated into the negative electrode during charge. In a full discharge state of the secondary battery 10, the capacity of the lithium metal remaining on the surface of the negative electrode is, for example, 0% or more and 200% or less of the positive electrode capacity.

The "capacity of the lithium metal remaining on the surface of the negative electrode" indicates the magnitude of the quantity of electricity corresponding to 3,861 mAh per gram of the lithium metal remaining on the surface of the negative electrode. The full discharge state of a lithium battery is a state in which the lithium secondary battery is discharged to the minimum voltage in a predetermined voltage range in the device fields in which the lithium secondary battery is used. Here, the "minimum voltage" indicates voltage at which the internal resistance is significantly increased through the discharge. For example, when a positive electrode active material is lithium cobalt oxide, the minimum voltage is 2.5 V to 3.0 V. In this case, the full discharge state of the lithium battery is a state in which the voltage of the lithium secondary battery is within a range from 2.5 V to 3.0V. Although the minimum voltage is varied depending on the kind of the positive electrode active material, the "minimum voltage" is generally within a range from 1.5 V to 3.0 V. In other words, the full discharge state of the lithium battery is typically a state in which the voltage of the lithium secondary battery is within a range from 1.5 V to 3.0 T.

The secondary battery 10 includes a lithium metal negative electrode. The SEI film may be formed on the surface of the lithium metal negative electrode. For example, when the secondary battery 10 is left in high-temperature atmosphere at 55° C. or higher is left for a long time, the thickness of the SEI film is increased. The lithium ions move through the SEI film during charge and discharge of the secondary battery 10. Accordingly, when the thickness of the SEI film is increased, the movement of the ions is likely to be impeded to increase the internal resistance of the secondary battery 10. Consequently, the increase in the thickness of the SEI film may cause degradation of the characteristics of the secondary battery 10. In particular, the increase in the thickness of the SEI film may cause degradation of high-current charge characteristics and high-current discharge characteristics of the secondary battery 10. In addition, the thick SEI film and the high internal resistance may excessively decrease negative electrode potential during charge of the secondary battery 10. The extent of the excessive decrease is made explicit in high-current charge. When the secondary battery is charged in the state in which the negative electrode potential is excessively decreased, the dendritic lithium metal is likely to be precipitated. This precipitation may cause a decrease in the capacity of the secondary battery 10, internal short circuit, and so on. The internal short circuit may cause abnormal increase in the internal temperature of the battery. However, with the technology according to the embodiment of the present disclosure, such a disadvantage is capable of being relieved or cleared.

The control apparatus 100 performs a control method. The control apparatus 100 is composed of, for example, a processor and a memory. The processor is, for example, a central processing unit (CPU) or a micro processing unit (MPU). The processor reads out a program stored in the memory and executes the program to perform the control method. The control apparatus 100 controls the secondary battery 10 in the above manner. Specifically, the control apparatus 100 controls charge and/or discharge of the secondary battery 10.

Figure 2:
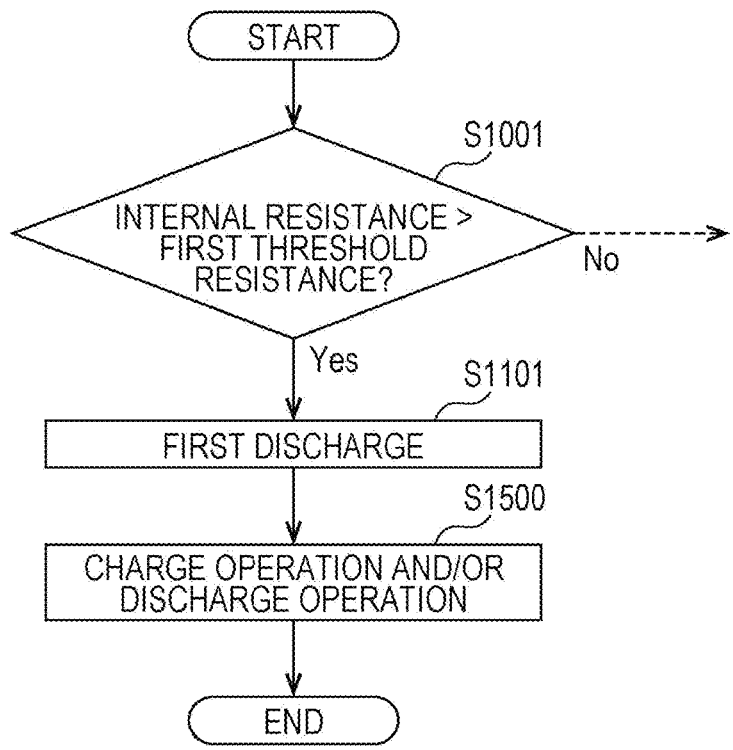
FIG. 2 is a flowchart illustrating an example of a control method in the first embodiment.

In an example, as illustrated in FIG. 2, in Step S1001, the control method determines whether the internal resistance of the secondary battery 10 is higher than a first threshold resistance. If the control method determines that the internal resistance of the secondary battery 10 is higher than the first threshold resistance (YES in Step S1001), in Step S1101, the control method performs first discharge of the secondary battery 10. After the first discharge, in Step S1500 the control method performs at least one of a charge operation of the secondary battery 10 and a discharge operation of the secondary battery 10. A state in which the internal resistance of the secondary battery 10 is temporarily increased is capable of being detected through the determination in Step S1001. The state is relieved or cleared through the first discharge in Step S1101. In this example, Step S1500 is performed after the first discharge. Accordingly, with this example, it is possible to perform the discharge operation and/or the charge operation of the secondary battery 10 in a state in which the internal resistance is sufficiently decreased.

When the charge operation is performed in the example in FIG. 2, the charge operation is capable of being performed in the state in which the internal resistance is sufficiently decreased. Accordingly, it is possible to suppress a decrease in the negative electrode potential in the charge operation. Consequently, it is possible to suppress formation of dendrite in the charge operation. The suppression of the formation of the dendrite enables the decrease in the capacity of the secondary battery 10 to be suppressed. This advantageously extends the lifetime of the secondary battery 10. This advantage is especially easily achieved in an application which the high-current charge is repeated.

When the discharge operation is performed in the example in FIG. 2, the discharge operation is capable of being performed in the state in which the internal resistance is sufficiently decreased. Accordingly, a decrease in the voltage of the secondary battery 10 in high-current discharge is capable of being suppressed to facilitate production of high power. In addition, a situation is easily avoided in which the battery system 1000 is abnormally stopped because the voltage of the secondary battery 10 during energization exceeds the lower limit of the voltage at which the battery system 1000 is operable.

The first threshold resistance is decreased as the average temperature is increased. The first threshold resistance is decreased as the amount of charge in the secondary battery 10 is increased. The first threshold resistance may be a fixed value.

The temporary increase in the internal resistance of the secondary battery 10 may be relieved or cleared through the first discharge of the secondary battery 10 in Step S1101. In this case, the control method includes Step S1101 in which the temporary increase in the internal resistance of the secondary battery 10 is relieved or cleared through the first discharge of the secondary battery 10. After the first discharge, Step S1500 is performed.

In an example, the capacity that is higher than 0% of the positive electrode capacity and that is not higher than 25% thereof is discharged from the secondary battery 10 through the first discharge. Limiting the capacity discharged through the first discharge to the range, defined in this example is appropriate for realizing the first discharge, which is capable of sufficiently decreasing the internal resistance for a short time. The capacity that is 5% or more and 20% or less of the positive electrode capacity may be discharged from the secondary battery 10 through the first discharge.

In an example, when the first discharge and the charge operation are performed, the capacity discharged from the secondary battery 10 through the first discharge is lower than the capacity charged in the secondary battery 10 in the charge operation. When the first discharge and the discharge operation are performed, the capacity discharged from the secondary battery 10 through the first discharge is lower than the capacity discharged from the secondary battery 10 in the discharge operation. With this example, it is possible to prevent excessive emission of the energy of the secondary battery 10 through the first discharge.

Figure 3:
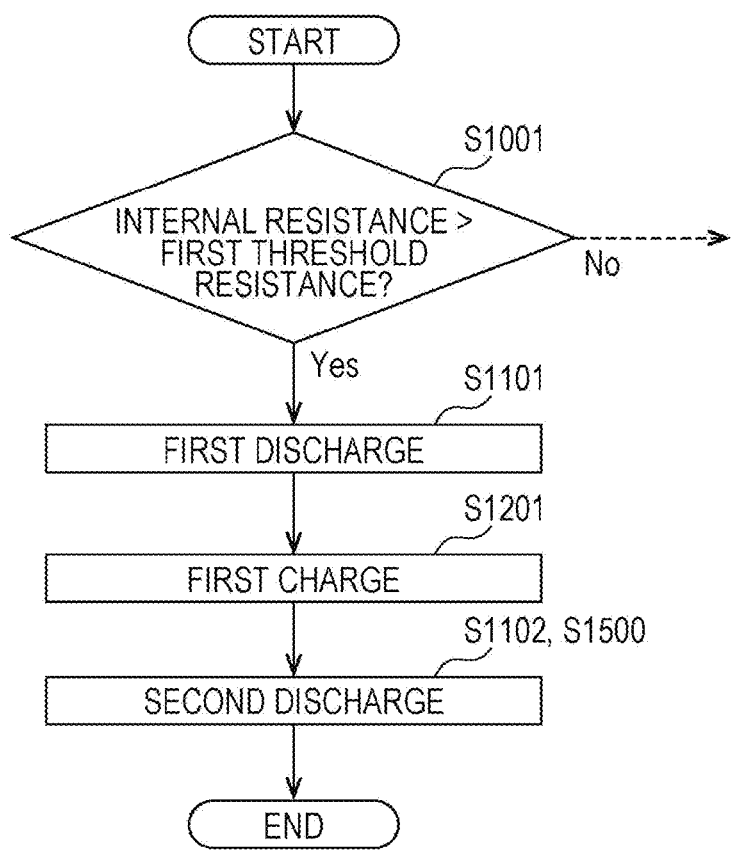
FIG. 3 is a flowchart illustrating an example of the control method in the first embodiment.
Figure 4:
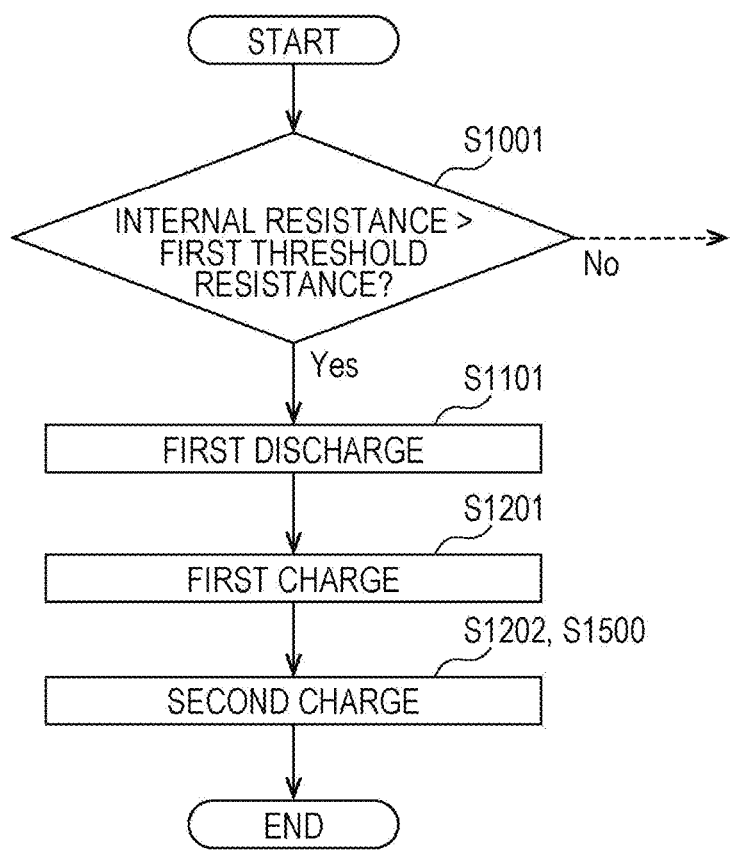
FIG. 4 is a flowchart illustrating an example of the control method in the first embodiment.

In an example, as illustrated in FIG. 3 and FIG. 4, the control method sequentially performs the first discharge of the secondary battery 10 in Step S1101 and first charge of the secondary battery 10 in Step S1201 if the control method determines that the internal resistance is higher than the first threshold resistance in Step S1001. After the first discharge in Step S1101 and the first charge in Step S1201, the control method performs at least one of Step S1202 in which second charge is performed as the charge operation and Step S1102 in which second discharge is performed as the discharge operation. The second discharge is performed in Step S1102 in the flowchart in FIG. 3. The second charge is performed in Step S1202 in the flowchart in FIG. 4. The high-current charge is capable of being performed as the second charge in this example. The high-current discharge is capable of being performed as the second discharge in this example. In this example, the first discharge is performed before the second charge and/or the second discharge. Accordingly, with this example, it is, possible to perform the high-current charge and/or the high-current discharge in the state in which the internal resistance is sufficiently decreased.

The technology in which the first charge follows the first discharge is applicable to all the examples, such as the example in FIG. 2.

In an example, the capacity charged in the secondary battery 10 through the first charge is higher than zero and lower than twice the capacity discharged from the secondary battery 10 through the first discharge. The first discharge may decrease the capacity remaining the secondary battery 10 to decrease the voltage of the secondary battery 10. If the amount of charge in the secondary battery 10 is excessively decreased through the first discharge, the resistance of the positive electrode may be mainly increased to increase the internal resistance of the secondary battery 10. However, with the first charge in this example, the discharge operation and/or the charge operation of the secondary battery 10 is capable of being performed in a state in which the decrease in the voltage of the secondary battery 10 and/or the increase in the internal resistance is suppressed. Through the first charge in this example, the amount of charge in the secondary battery 10 comes close to a value at the time when the first discharge is started. The capacity charged in the secondary battery 10 through the first charge may be lower than 1.5 times the capacity discharged from the secondary battery 10 through the first discharge, may be lower than 1.2 times the capacity discharged from the secondary battery 10 through the first discharge, or may be lower than 1.1 times the capacity discharged from the secondary battery 10 through the first discharge. The capacity charged in the secondary battery 10 through the first charge may be higher than 0.5 times the capacity discharged from the secondary battery 10 through the first discharge, may be higher than 0.8 times the capacity discharged from the secondary battery 10 through the first discharge, or may be higher than 0.9 times the capacity discharged from the secondary battery 10 through the first discharge. The capacity charged in the secondary battery 10 through the first charge may be the same as the capacity discharged from the secondary battery 10 through the first discharge.

Figure 5:
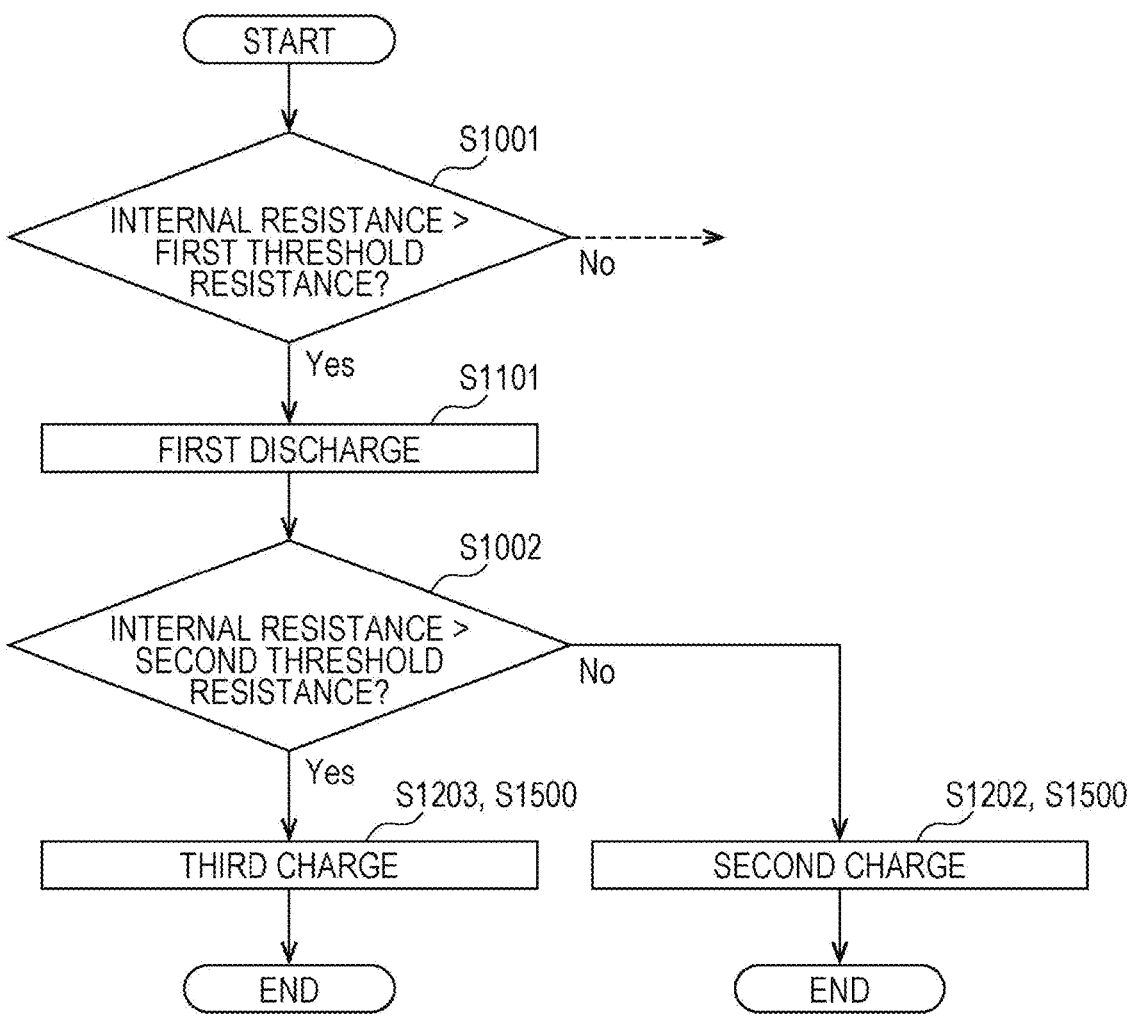
FIG. 5 is a flowchart illustrating an example of the control method in the first embodiment.

In an example a control method is performed using the control apparatus 100. The control apparatus 100 is configured so as to perform third charge of the secondary battery 10 and the second charge of the secondary battery 10, in which the secondary battery 10 is charged with charge current larger than that of the third charge. As illustrated in FIG. 5, after the first discharge in Step S1101, in Step S1002, the control method determines whether the internal resistance is higher than a second threshold resistance. If the control method determines that the internal resistance is higher than the second threshold resistance (YES in Step S1002), in Step S1203, the control method performs the third charge as the charge operation. If the control method determines that the internal resistance is not higher than the second threshold resistance (NO in Step S1002), in Step S1202, the control method performs the second charge as the charge operation. When the internal resistance of the secondary battery 10 is low, the negative electrode potential of the secondary battery 10 is less likely to be decreased in the charge of the secondary battery 10 and the dendrite is less likely to be formed. When the charge current of the secondary battery 10 is small, the negative electrode potential of the secondary battery 10 is less likely to be decreased in the charge of the secondary battery 10 and the dendrite is less likely to be formed. In this point, the high-current charge is capable of being performed as the second charge in this example. Low-current charge is capable of being performed as the third charge in this example. With this example, it is possible to perform the third charge if the internal resistance is high. Accordingly, a situation is capable of being avoided, in which the formation of the dendrite is promoted because of the high internal resistance and the large charge current when the internal resistance is high. With this example, it is possible to perform the second charge if the internal resistance is low. Accordingly, the secondary battery 10 is capable of being rapidly charged through the high-current charge in a situation in which the formation of the dendrite can be suppressed because of the low internal resistance.

The second threshold resistance is capable of being set in the same aspect as in the first threshold resistance. The second threshold resistance may be equal to the first threshold resistance, may be lower than the first threshold resistance, or may be higher than the first threshold resistance.

Figure 6:
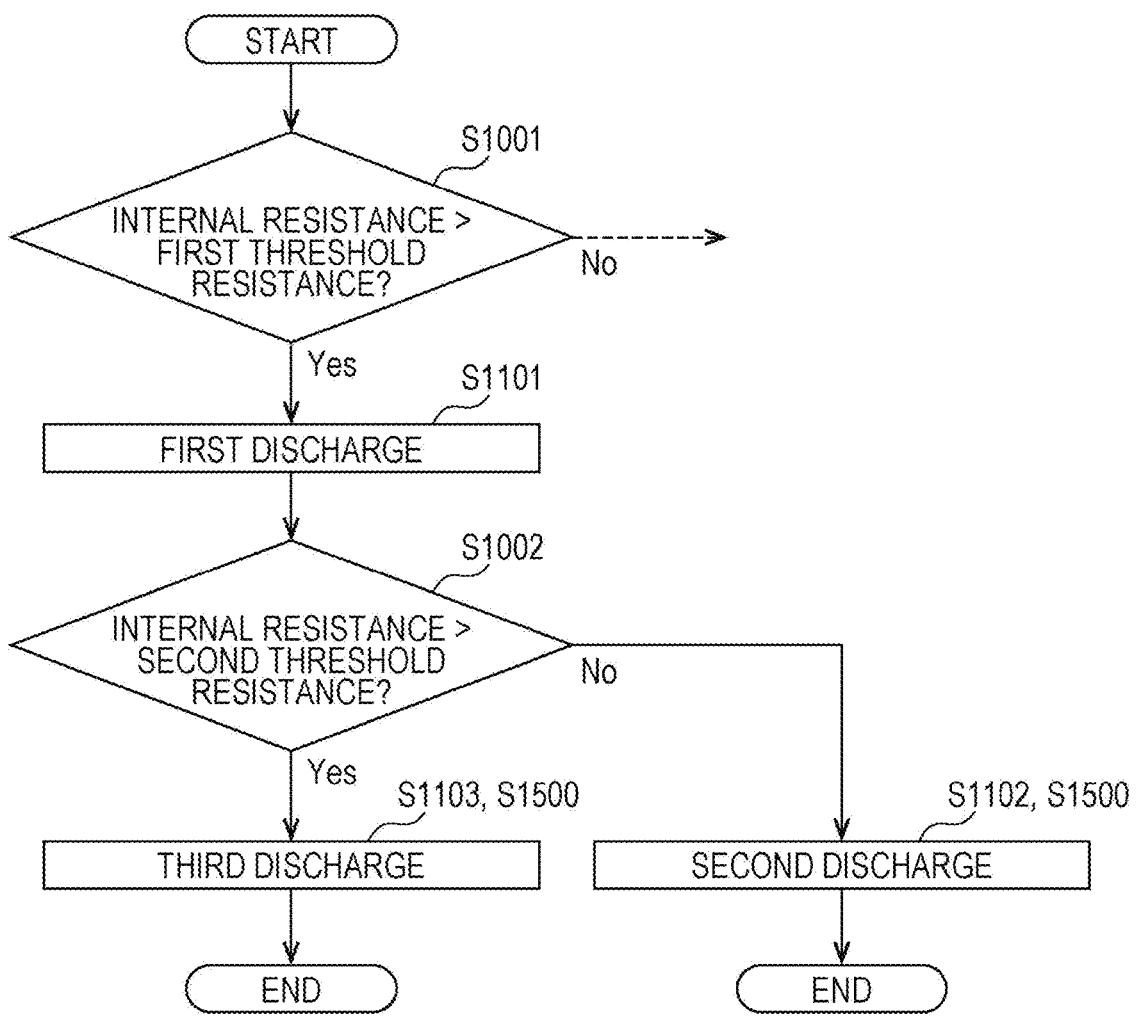
FIG. 6 is a flowchart illustrating an example of the control method in the first embodiment.

In an example, a control method is performed using the control apparatus 100. The control apparatus 100 is configured so as to perform third discharge of the secondary battery 10 and the second discharge of the secondary battery 10, in which the secondary battery 10 is discharged with discharge current larger than that of the third discharge. As illustrated in FIG. 6, after the first discharge in Step S1101, in Step S1002, the control method determines Whether the internal resistance is higher than the second threshold resistance. If the control method determines that the internal resistance is higher than the second threshold resistance (YES in Step S1002), in Step S1103, the control method performs the third discharge as the discharge operation. If the control method determines that the internal resistance is not higher than the second threshold resistance (NO in Step S1002), in Step S1102, the control method performs the second discharge as, the discharge operation. With this example, it is possible to perform the third discharge if the internal resistance is high. Accordingly, it is possible to avoid an occurrence of a problem caused by the high-current discharge that is performed when the internal resistance is high. Specifically, the voltage of the secondary battery 10 is decreased in the discharge by a value resulting from multiplication of the internal resistance by the current value. If the high-current discharge is performed when the internal resistance is high and the voltage of the secondary battery 10 exceeds the lower limit of the voltage at which the battery system 1000 is operable, the battery system 1000 may be abnormally stopped. In addition, such a reduction in the voltage of the battery during discharge may greatly decrease the output from the secondary battery 10. However, it is possible to avoid an occurrence of such a problem with this example. With this example, it is possible to perform the second discharge if the internal resistance is low. Accordingly, the secondary battery 10 is capable of being rapidly discharged through the high-current discharge in a situation in which the above problem is less likely to occur because of the low internal resistance.

Figure 7:
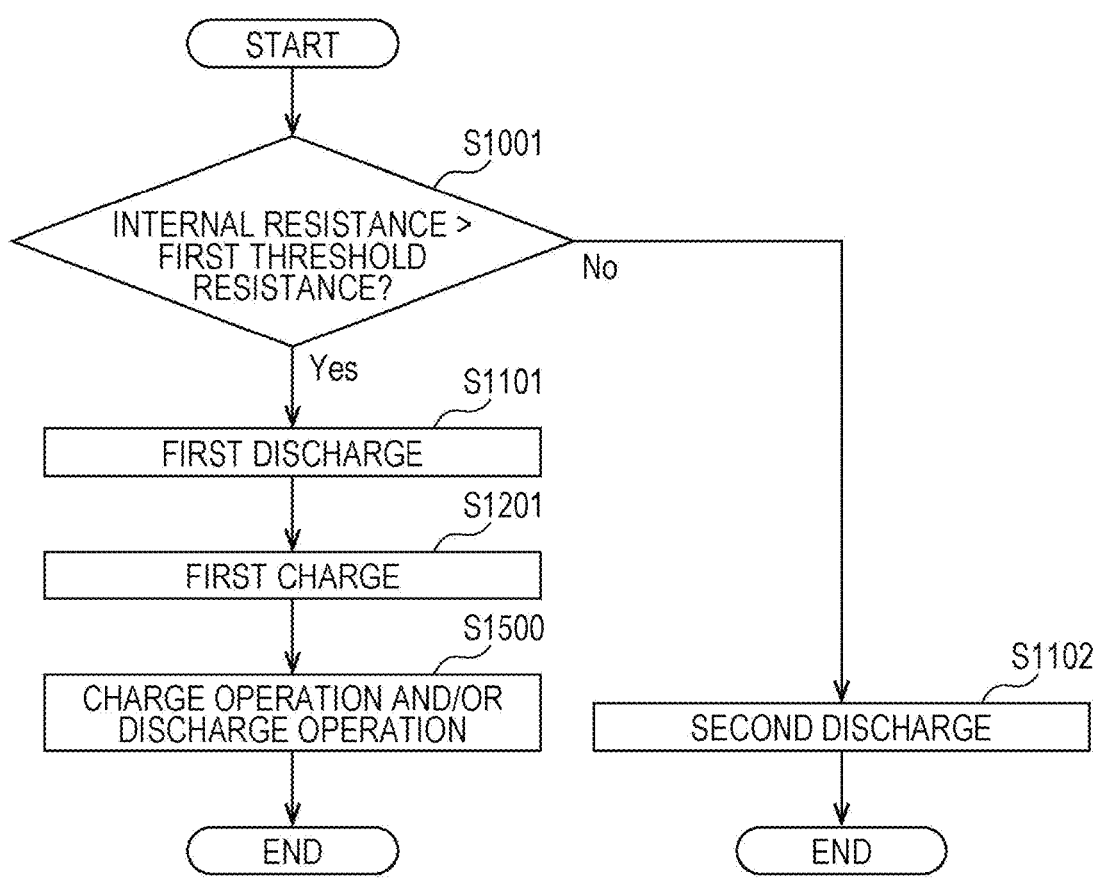
FIG. 7 is a flowchart illustrating an example of the control method in the first embodiment.
Figure 8:
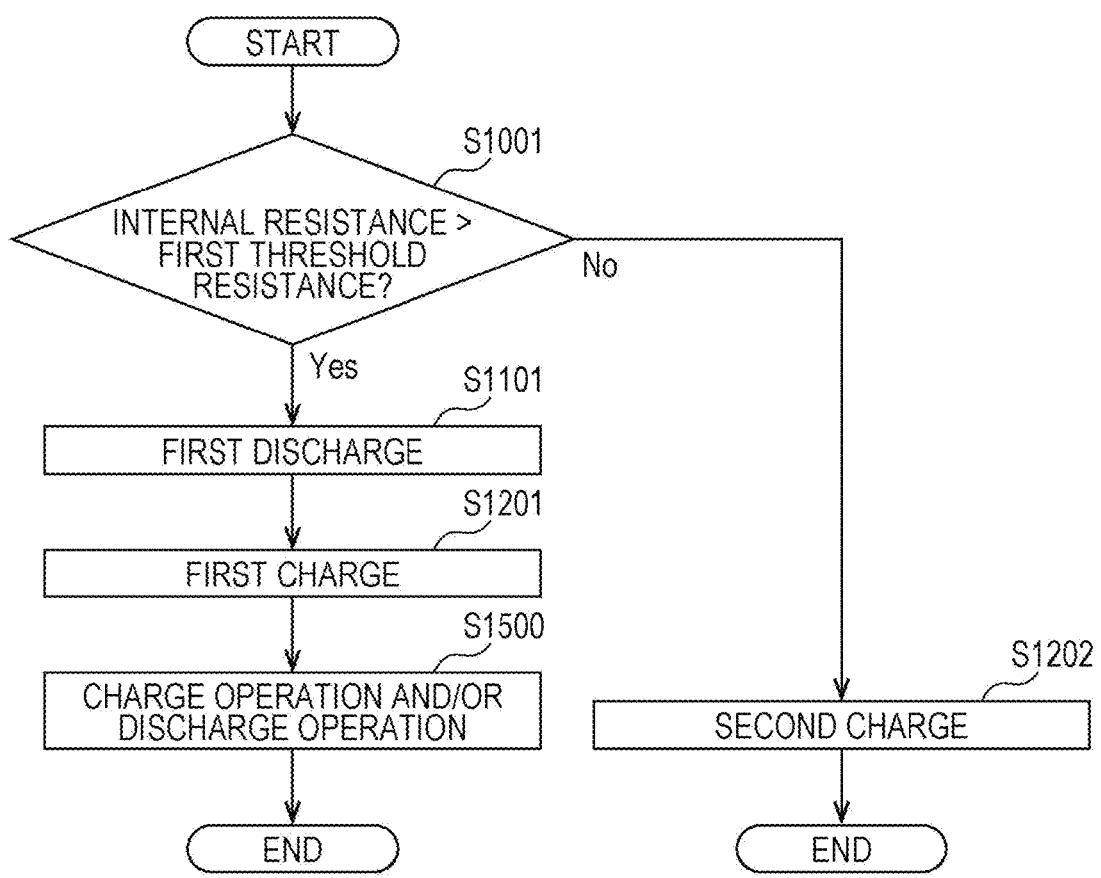
FIG. 8 is a flowchart illustrating an example of the control method in the first embodiment.

In an example, as illustrated in FIG. 7 and FIG. 8, the control method sequentially performs the first discharge of the secondary battery 10 in Step S1101 and the first charge of the secondary battery 10 in Step S1201 if the control method determines that the internal resistance is higher than the first threshold resistance in Step S1001. After the first discharge in Step S1101 and the first charge in Step S1201, in Step S1500, the control method performs at least one of the charge operation and the discharge operation. If the control method determines that the internal resistance is not higher than the first threshold resistance (NO in Step S1001), the control method does not perform the first discharge and the first charge. In this case, the control method performs at least one of the second charge of the secondary battery 10 in Step S1202 and the second discharge of the secondary battery 10 in Step S1102. The second charge is the charge with the charge current, larger than that of the first charge. The second discharge is the discharge with the discharge current larger than that of the first discharge. The second discharge is performed in Step S1102 in the flowchart in FIG. 7 if the control method determines that the internal resistance is not higher than the first threshold resistance. The second charge is performed in Step S1202 in the flowchart in FIG. 8 if the control method determines that the internal resistance is not higher than the first threshold resistance. The high-current charge is capable of being performed as the second charge in this example. In this case, it is possible to rapidly charge the secondary battery 10 through the high-current charge in the situation in which the formation of the dendrite can be suppressed because of the low internal resistance. The high-current discharge is capable of being performed as the second discharge in this example. In this case, it is possible to produce large output from the secondary battery 10 through the high-current discharge in the situation in which the above problem is less likely to occur because of the low internal resistance.

Figure 9:
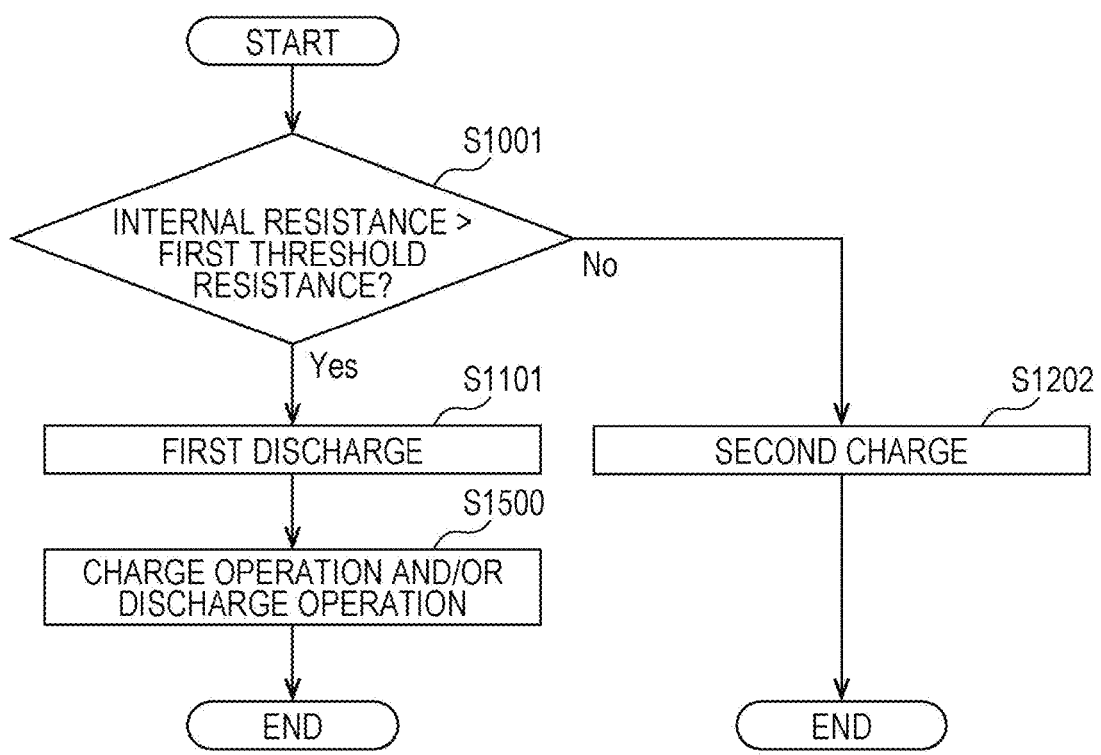
FIG. 9 is a flowchart illustrating an example of the control method in the first embodiment.

In an example, a control method is performed using the control apparatus 100. The control apparatus 100 is configured so as to perform the third charge of the secondary battery 10 and the second charge of the secondary battery 10, in which the secondary battery 10 is charged with the charge current larger than that of the third charge. As illustrated in FIG. 9, if the control method determines that the internal resistance is not higher than the first threshold resistance in Step S1001, the control method does not perform the first discharge. In this case, in Step S1202, the control method performs the second charge. The high-current charge is capable of being performed as the second charge in this example. With this example, it is possible to rapidly charge the secondary battery 10 through the high-current charge in the situation in which the formation of the dendrite can be suppressed because of the low internal resistance.

Figure 10:
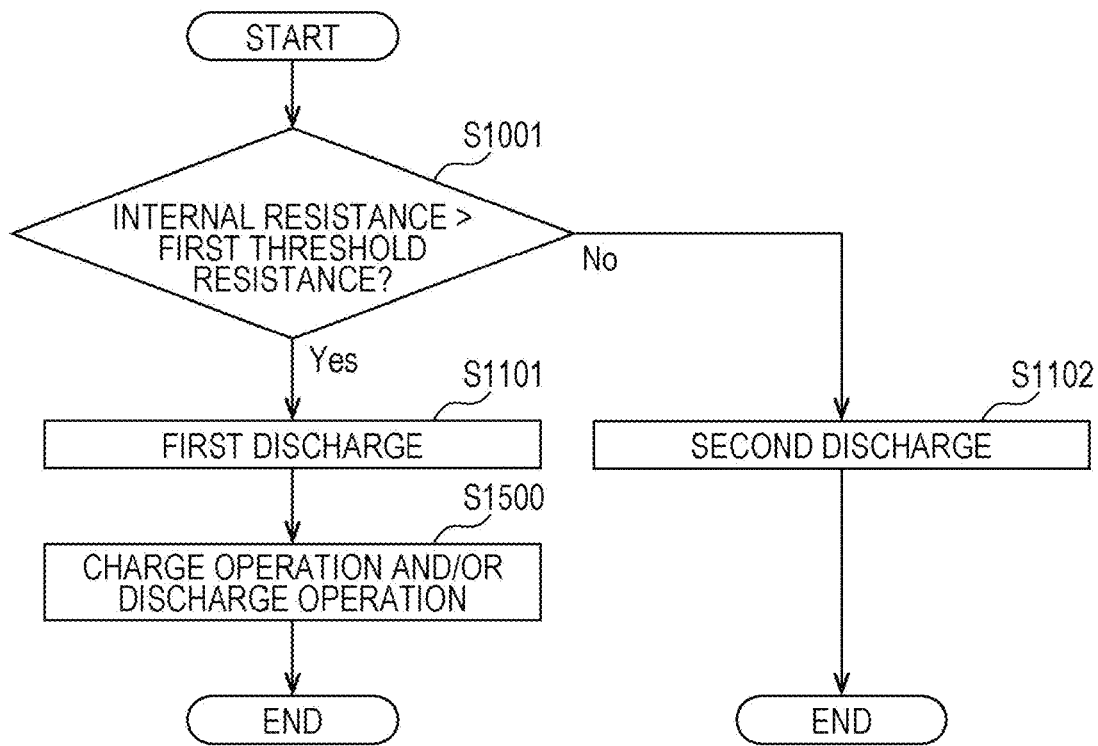
FIG. 10 is a flowchart illustrating an example of the control method in the first embodiment.

In an example, a control method is performed using the control apparatus 100. The control apparatus 100 is configured so as to perform the third discharge of the secondary battery 10 and the second discharge of the secondary battery 10, in which the secondary battery 10 is discharged with the discharge current larger than that of the third discharge. As illustrated in FIG. 10, if the control method determines that the internal resistance is not higher than the first threshold resistance in Step S1001, the control method does not perform the first discharge. In this case, in Step S1102, the control method performs the second discharge. The high-current discharge is capable of being performed as the second discharge in this example. With this example, it is possible to produce large output from the secondary battery 10 through the high-current discharge in the situation in which the above problem is less likely to occur because of the low internal resistance.

In an example, if a calculated value of the internal resistance is higher than the first threshold resistance, it is determined that the internal resistance is higher than the first threshold resistance. The calculated value is calculated from detection data about the secondary battery 10. The detection data includes at least one of the detection value of the voltage of the secondary battery 10 and the detection value of the current of the secondary battery 10. With this example, it is possible to accurately calculate the internal resistance of the secondary battery 10. The control method in this example is capable of being realized using, for example, a battery system 1100 illustrated in FIG. 11. The battery system 1100 includes a detection unit 200, in addition to the components in the battery system 1000. The detection unit 200 acquires the detection data. The calculation of the internal resistance is performed in Step S1301 illustrated in FIG. 12. Step S1301 is performed before Step S1001.

In an example, the control method is performed using the control apparatus 100. The control apparatus 100 is configured so as to perform pulse energization, which is pulse discharge or pulse charge, of the secondary battery 10. Closed circuit voltage, which is the voltage of the secondary battery 10 during the pulse energization, the current of the secondary battery 10 during the pulse energization, and open circuit voltage, which is the voltage of the secondary battery 10 during non-energization before the pulse energization is performed, are used for the calculation of the calculated value. With this example, it is possible to particularly accurately calculate the internal resistance of the secondary battery 10.

Figure 13:
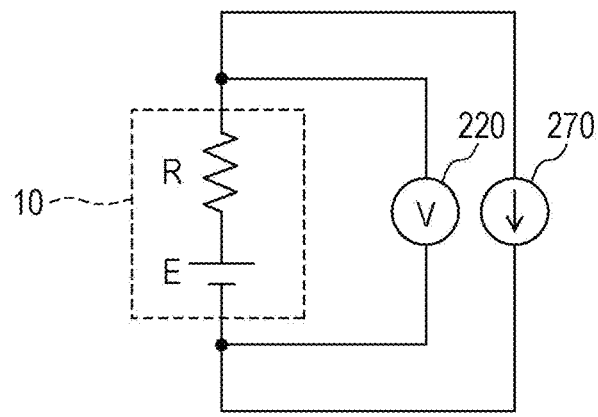
FIG. 13 is an explanatory diagram of an example of a detection unit.

In an example, the detection unit 200 detects the voltage between terminals of the secondary battery 10 in a state in which the current is applied to the secondary battery 10. A specific example of the detection unit 200 will now be described with reference to FIG. 13. In this specific example, the detection unit 200 includes a current application unit 270 and a voltage measurement unit 220. The current application unit 270 is, for example, a current source. The voltage measurement unit 220 is, for example, a voltmeter. When the output current from the current application unit 270 is zero (0), the voltage measurement unit 220 measures open circuit voltage OCV, which is the voltage of the secondary battery 10 during the non-energization before the pulse energization is performed. After a predetermined time elapsed since the output current from the current application unit 270 is I (≠0), the voltage measurement unit 220 measures closed circuit voltage CCV of the secondary battery 10. The predetermined time may be set to about two to ten seconds in terms of prevention of a reduction in the accuracy of the measurement of the voltage due to the predetermined time that is too short. Internal resistance R of the secondary battery 10 is calculated according to Equation (1):

$$R=(OCV-CCV)/I \tag{1}$$

In this specific example, the detection unit 200 generates a measurement signal. The measurement signal is input into the control apparatus 100. The measurement signal may be a signal having the correlation with the measurement result by the voltage measurement unit 220. A current application unit having a known configuration may be used as the current application unit 270. A voltage measurement unit having a known configuration may be used as the voltage measurement unit 220.

Figure 14:
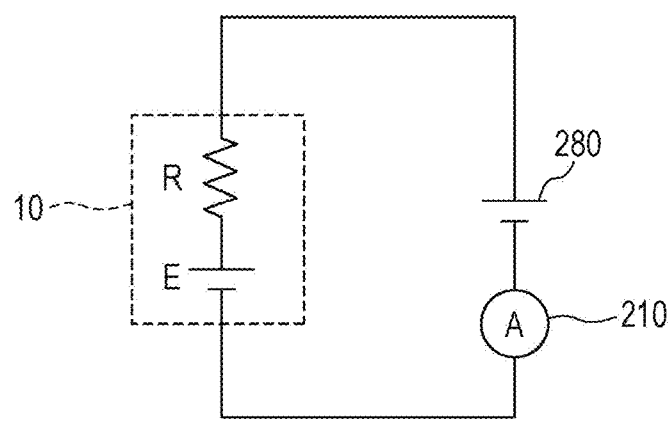
FIG. 14 is an explanatory diagram of another example of the detection unit.

In another example, the detection unit 200 detects the current flowing through the secondary battery 10 in a state in which the voltage is applied between the terminals of the secondary battery 10. A specific example of the detection unit 200 will now be described with reference to FIG. 14. In this specific example, the detection unit 200 includes a voltage application unit 280 and a current measurement unit 210. The voltage application unit 280 is, for example, a voltage source. The current measurement unit 210 is, for example, an ammeter. Detected current by the current measurement unit 210 when no voltage is output from the voltage application unit 280, that is, when the voltage application unit 280 behaves as a conductor line having resistance of zero is denoted by I1. Detected current by the current measurement unit 210 when the voltage application unit 280 outputs voltage V (≠ zero) is denoted by I2. The internal resistance R of the secondary battery 10 is calculated according to Equation (2):

$$R=V/(I1-I2) \quad (2)$$

In this specific example, the detection unit 200 generates the measurement signal. The measurement signal is input into the control apparatus 100. The measurement signal may be a signal having the correlation with the measurement result by the current measurement unit 210. A voltage application unit having a known configuration may be used as the voltage application unit 280. A current measurement unit having a known configuration may be used as the current measurement unit 210.

In Equation (1) and Equation (2), R denotes direct-current internal resistance DC-IR. R may denote alternating-current impedance AC-IR.

Figure 22:
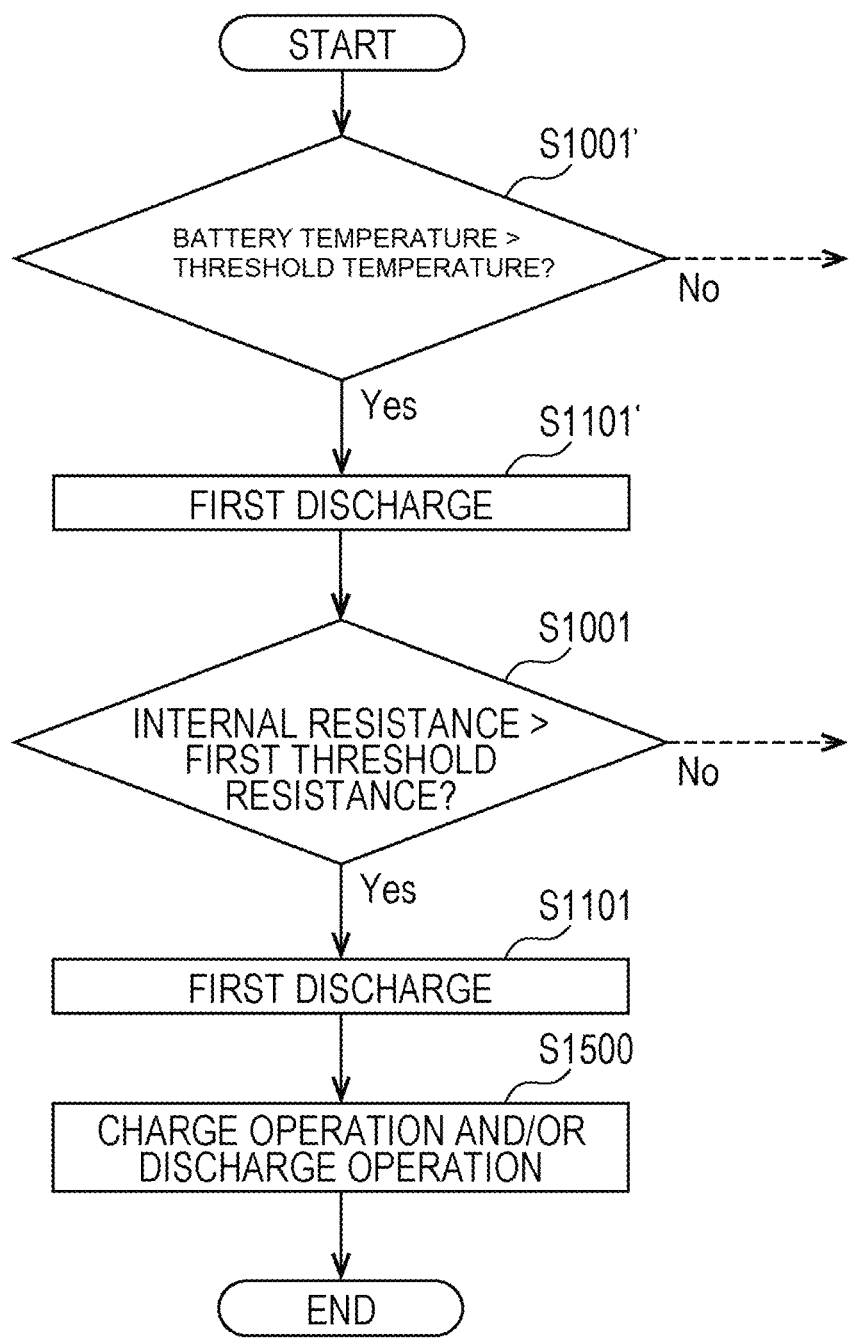
FIG. 22 is a flowchart illustrating an example of the control method.

In an example, as depicted in FIG. 22, the first discharge in Step S1101 is performed also if the temperature of the secondary battery 10 is higher than a threshold temperature. According to the review by the inventor, the temporary increase in the internal resistance of the secondary battery 10 is gradually increased during a period in which the energization of the secondary battery 10 is not performed. When the temperature of the secondary battery 10 is high, the temporary increase is rapidly increased. Accordingly, the temporary increase may reach a significant extent when the temperature of the secondary battery 10 is high. In order to resolve this problem, in this example, the first discharge is performed when the temperature of the secondary battery 10 is high.

This enables the discharge operation and/or the charge operation of the secondary battery 10 to be avoided in the state in which the internal resistance of the secondary battery 10 is temporarily increased. The control method in this example is capable of being realized using, for example, a battery system 1200 illustrated in FIG. 15. The battery system 1200 includes a measurement unit 300, in addition to the components in the battery system 1000. The measurement unit 300 measures the temperature of the secondary battery 10. In a specific example, the measurement unit 300 measures the temperature of a portion on a side face of an exterior can of the secondary battery 10. The "exterior can" corresponds to a case main body 15 illustrated in FIG. 20.

The temperature of the secondary battery 10 may be the detection value of a temperature sensor in the measurement unit 300. The detection value may be the current detection value. The detection value may be the average value of the detection values from a certain time point to the current moment. The certain time point is the last time when a relay circuit electrically connected to the secondary battery 10 is disconnected in a specific example. The certain time point is the last time when the energization of the secondary battery 10 is terminated in another specific example. The last time when the energization of the secondary battery 10 is terminated is the later time, among the last time when the discharge of the secondary battery 10 is terminated and the last time when the charge of the secondary battery 10 is terminated. The threshold temperature described above is, for example, a temperature from 30° C. to 70° C. The threshold temperature is 55° C. in a specific example. The measurement unit 300 is, for example, a thermometer. The thermometer composing the measurement unit 300 may be a contact thermometer or may be a non-contact thermometer. A thermometer having a known configuration is generally used as the thermometer composing the measurement unit 300.

Figure 16:
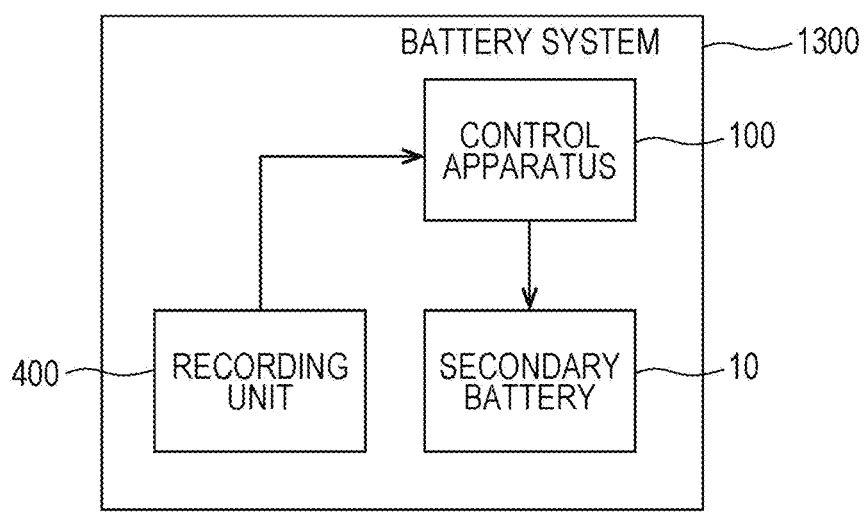
FIG. 16 is a block diagram illustrating an example of the schematic configuration of a battery system in the first embodiment.

In an example, the first discharge in Step S1101 is performed also if a count time is longer than a threshold time. The count time is the duration from the last time when the energization of the secondary battery 10 is terminated or a time later than the last time when the energization of the secondary battery 10 is terminated. The last time when the energization of the secondary battery 10 is terminated indicates the later time, among the last time when the discharge of the secondary battery 10 is terminated and the last time when the charge of the secondary battery 10 is terminated. When the count time is long, the temporary increase in the internal resistance of the secondary battery 10 may reach a significant extent. In order to resolve this problem, in this example, the first discharge is performed when the count time is long. This enables the discharge operation and/or the charge operation of the secondary battery 10 to be avoided in the state in which the internal resistance of the secondary battery 10 is temporarily increased. The control method in this example is capable of being realized using, for example, a battery system 1300 illustrated in FIG. 16. The battery system 1300 includes a recording unit 400, in addition to the components in the battery system 1000. The recording unit 400 records the count time. The first charge is capable of being performed if the count time recorded in the recording unit 400 is longer than the threshold time.

The time when the counting of the count time is started is the last time when the relay circuit electrically connected to the secondary battery 10 is disconnected in a specific example. The time when the counting is started is the last time when the energization of the secondary battery 10 is terminated in another specific example. The count time is typically the time from the time when the counting is started to the current moment.

The threshold time described above is, for example one month. The threshold time may be varied depending on the temperature of the secondary battery 10. For example, when the temperature of the secondary battery 10 is 35° C., the threshold time is one month. The threshold time may be decreased as the secondary battery 10 has the higher temperature. The threshold time may be a fixed value.

The recording unit 400 is, for example, a memory. Specifically, the memory composing the recording unit 400 may be a semiconductor memory or may be a magnetic recording device. A memory having a known configuration is generally used as the memory composing the recording unit 400.

Figure 23:
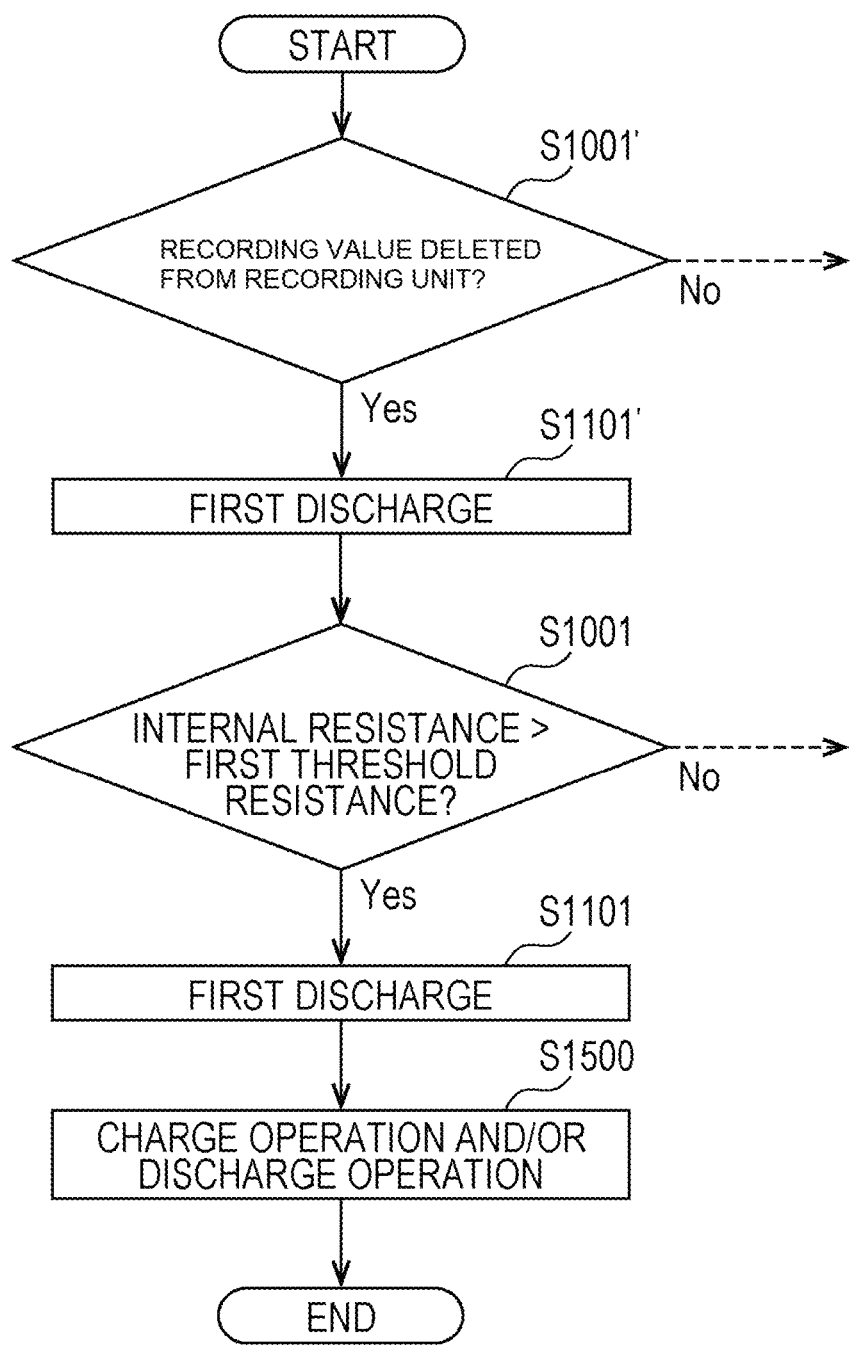
FIG. 23 is a flowchart illustrating an example of the control method.

In an example, as depicted in FIG. 23, the first discharge in Step S1101 is performed also if a recording value that indicates the count time and that should be recorded is not recorded in the recording unit 400 (e.g., deleted from the recording unit 400). When the recording value indicating the count time is not recorded, the count time is unknown. In this case, the count time may be long and the temporary increase in the internal resistance of the secondary battery 10 may reach a significant extent. In order to resolve this problem, in this example, the first discharge is performed when the recording value indicating the count time is not recorded. This enables the discharge operation and/or the charge operation of the secondary battery 10 to be avoided in the state in which the internal resistance of the secondary battery 10 is temporarily increased.

The case in which the recording value is not recorded in the battery system 1300 is exemplified by a case in which the recording value is deleted from the recording unit 400.

Part or all of the technologies in the respective examples may be appropriately combined.

Second Embodiment

Specific examples of a battery system and a control method according to a second embodiment of the present disclosure will now be described. Part or all of the technologies in the first embodiment may be appropriately combined with part or all of the technologies in the second embodiment.

Examples of the battery system of the second embodiment will be described with reference to FIG. 17A, FIG. 17B, and FIG. 17C. The same reference numerals are used in the following description to identify the same components or similar components. A description of such components may be omitted herein.

Figure 17A:
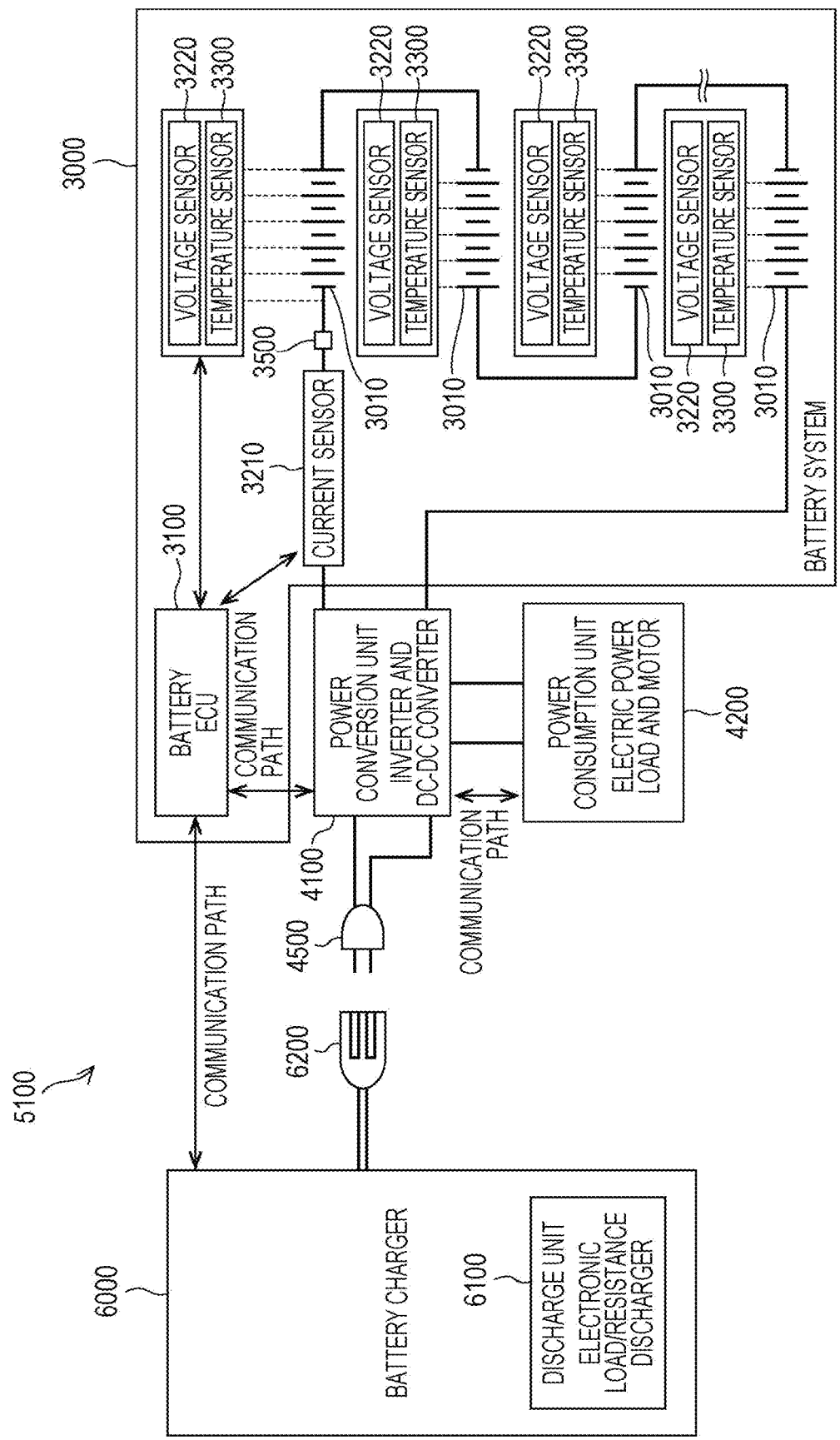
FIG. 17A is a block diagram for describing an example to which a battery system in a second embodiment is applied.

A battery system 3000 illustrated in FIG. 17A is incorporated in an electric vehicle (hereinafter sometimes referred to as an EV) 5100. The EV 5100 includes the battery system 3000, a power conversion unit 4100, a power consumption unit 4200, and a connection unit 4500. The EV 5100 is connectable to a battery charger 6000.

In this example, the battery system 3000 is separated from the components including the power conversion unit 4100, the power consumption unit 4200, and the battery charger 6000 for convenience of description. However, the concept of the battery system should not be limitedly interpreted because of the above configuration. The battery system may be interpreted as a system including, such components.

The batter system 3000 includes multiple secondary battery cells 3010, a current sensor 3210, multiple voltage sensors 3220, multiple temperature sensors 3300, a battery electronic control unit (ECU) 3100, and a relay circuit 3500.

The secondary battery cells 3010 are lithium secondary battery cells. The multiple secondary battery cells 3010 are connected in series to each, other. This composes a secondary battery module. This module ma be hereinafter referred to as a secondary battery module 3010. The entire secondary battery module 3010 composes an assembled battery.

The current sensor 3210 detects the current flowing through the secondary battery cells 3010. One voltage sensor 3220 and one temperature sensor 3300 are associated with one secondary battery cell 3010. This enables the voltages and the temperatures of the respective secondary battery cells 3010 to be measured. However, one voltage sensor 3220 and one temperature sensor 3300 may be associated with the multiple secondary battery cells 3010.

The relay circuit 3500 is provided between the current sensor 3210 and the secondary battery cells 3010. The relay circuit 3500 is capable of electrically separating the current sensor 3210 from the secondary battery cells 3010.

The battery ECU 3100 controls the current sensor 3210, the respective voltage sensors 3220, the respective temperature sensors 3300, the relay circuit 3500, the power conversion unit 4100, the battery charger 6000, and so on using an electronic circuit.

The power conversion unit 4100 includes art inverter and a direct current-direct current (DC-DC) converter. The inverter is a bidirectional inverter capable of converting direct-current power into alternating-current power and capable of converting the alternating-current power into the direct-current power.

The power consumption unit 4200 includes an electric power load and a motor.

The battery charger 6000 includes a discharge unit 6100 and a connection unit 6200. The discharge unit 6100 is exemplified by, for example, an electronic load or a resistance discharger.

The battery ECU 3100 in the EV 5100 is capable of communicating with the current sensor 3210, the power conversion unit 4100, the battery charger 6000, and so on. A mode is illustrated in FIG. 17A in which the battery ECU 3100 is capable of communicating with one voltage sensor 3220 and one temperature sensor 3300 for convenience of the drawing. The battery ECU 3100 is capable of practically communicating with the respective voltage sensors 3220 and the respective temperature sensors 3300. The battery ECU 3100 is also capable of communicating with the relay circuit 3500 although not illustrated in FIG. 17A for convenience. The power conversion unit 4100 in the EV 5100 is capable of communicating with the power consumption unit 4200. The communication described above is capable of being established via a wired communication path or a wireless communication path.

The secondary battery module 3010 in the EV 5100 is capable of being charged with the battery charger 6000. The connection unit 6200 is connected to the connection unit 4500 for the charge. The alternating-current power flows from the battery charger 6000 to the power conversion unit 4100 through the connection unit 6200 and the connection unit 4500. The alternating-current power is converted into the direct-current power by the inverter in the power conversion unit 4100. Then, the voltage of the direct-current power is converted into the magnitude appropriate for the charge of the secondary battery module 3010 by the DC-DC converter in the power conversion unit 4100. The direct-current power subjected to the conversion in the DC-DC converter is supplied to the secondary battery module 3010. The secondary battery module 3010 is charged in the above manner.

The battery system 3000 in the EV 5100 is capable of supplying the power to the power consumption unit 4200. The direct-current power, is supplied from the secondary battery module 3010 to the power conversion unit 4100 for the power supply. The magnitude of the voltage of the direct-current power is converted by the DC-DC converter in the power conversion unit 4100. The direct-current power subjected to the conversion in the DC-DC converter is converted into the alternating-current power by the inverter in the power conversion unit 4100. The alternating-current power is supplied to the power consumption unit 4200. The motor in the power consumption unit 4200 rotates wheels (not illustrated) using the alternating-current power. The electric power load in the power consumption unit 4200 operates using the alternating-current power.

The battery system 3000 in the EV 5100 is capable of discharging the power to the battery charger 6000. The connection unit 6200 is connected to the connection unit 4500 for the power discharge. The direct-current power is supplied from the secondary battery module 3010 to the power conversion unit 4100. The magnitude of the voltage of the direct-current power is converted by the DC-DC converter in the power conversion unit 4100. The direct-current power subjected to the conversion in the DC-DC converter is converted into the alternating-current power by the inverter in the power conversion unit 4100. The alternating-current power flows into the battery charger 6000 through the connection unit 4500 and the connection unit 6200. The alternating-current power is consumed in the discharge unit 6100 in the battery charger 6000.

Figure 17B:
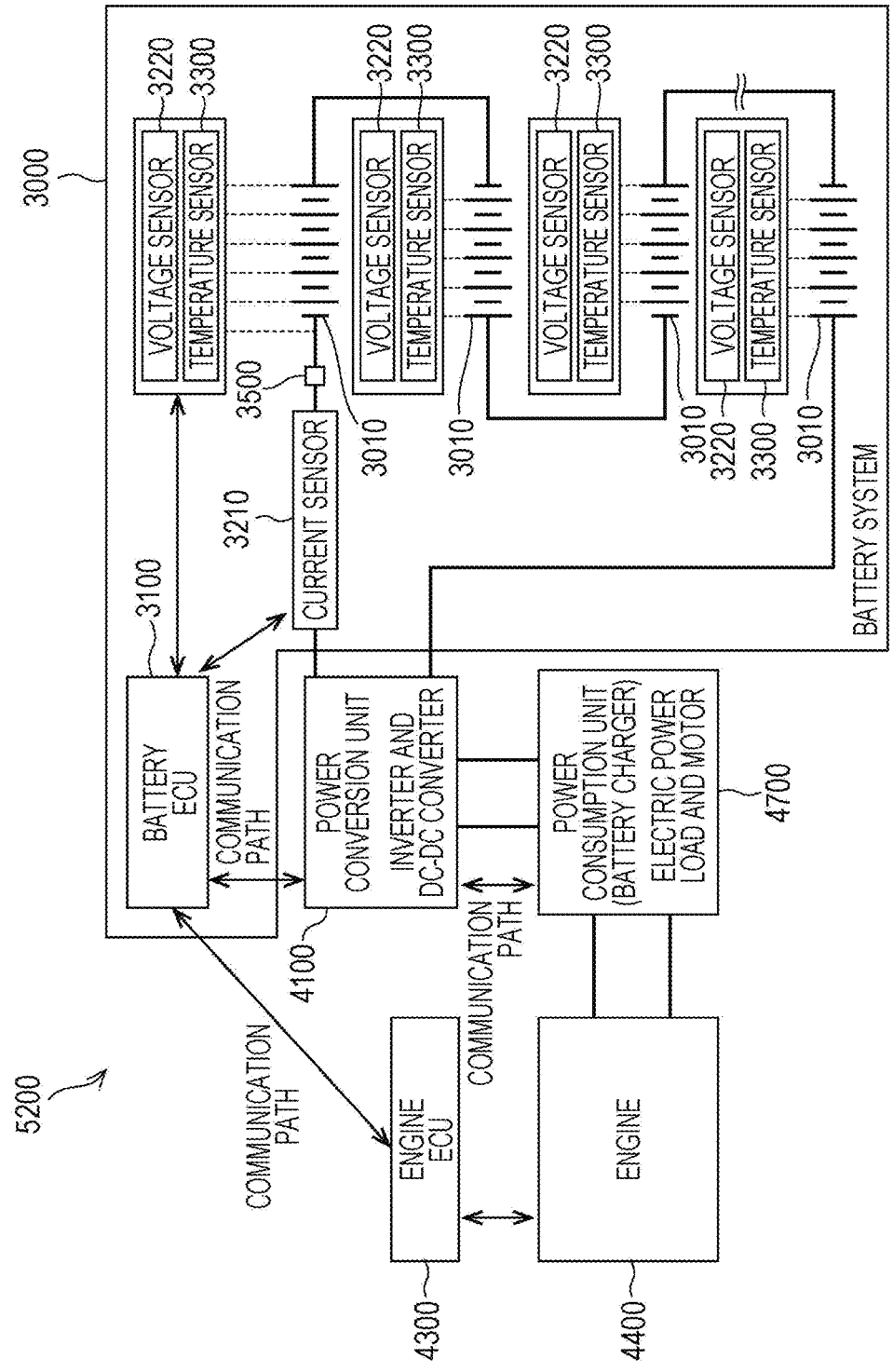
FIG. 17B is a block diagram for describing another example to which the battery system in the second embodiment is applied.

As illustrated in FIG. 17B, the battery system 3000 may be incorporated in a hybrid car (hereinafter sometimes referred to as an HV) 5200. The HV 5200 includes the battery system 3000, the power conversion unit 4100, a power consumption unit 4700, an engine ECU 4300, and an engine 1400.

The engine ECU 4300 controls the engine 4400 using an electronic circuit. The engine 4400 rotates the wheels (not illustrated).

The power consumption unit 4700 includes an electric power load and a motor. The electric power load functions as a discharge unit that consumes the discharge power in the discharge of the secondary battery module 3010. The electric power load is, for example, an electric air conditioner, a rear window defogger, an electric heater, or a resistance discharger that is installed in advance. The electric power load in the power consumption unit 4200 may also function as the discharge unit described above.

The battery ECU 3100 in the HV 5200 is capable of communicating with the current sensor 3210, the respective voltage sensors 3220, the respective temperature sensors 3300, the relay circuit 3500, the power conversion unit 4100, the engine ECU 4300, and so on. The power conversion unit 4100 is capable of communicating with the power consumption unit 4700. The engine ECU 4300 is capable of communicating with the engine 4400. The communication described above is capable of being established via a wired communication path or a wireless communication path.

The battery system 3000 in the HV 5200 is capable of supplying the power to the power consumption unit 4700. The aspect of the power supply in this case is the same as that of the power supply from the battery system 3000 in the EV 5100 to the power consumption unit 4200.

The motor in the power consumption unit 4700 in the HV 5200 is capable of performing a regeneration operation. Specifically, when the brake is applied to the HV 5200, the motor supplies the alternating-current power to the power conversion unit 4100 through the regeneration operation. The alternating-current power is converted into the direct-current power by the inverter in the power conversion unit 4100. The voltage of the direct-current power is converted into the magnitude appropriate for the charge of the secondary battery module 3010 by the DC-DC converter in the power conversion unit 4100. The direct-current power subjected to the conversion in the DC-DC converter is supplied to the secondary battery module 3010. The secondary battery module 3010 is charged in the above manner. As described above, the motor in the power consumption unit 4700 functions as the battery charger in the regeneration operation. In other words, the power consumption unit 4700 also function; as a power generator.

Figure 17C:
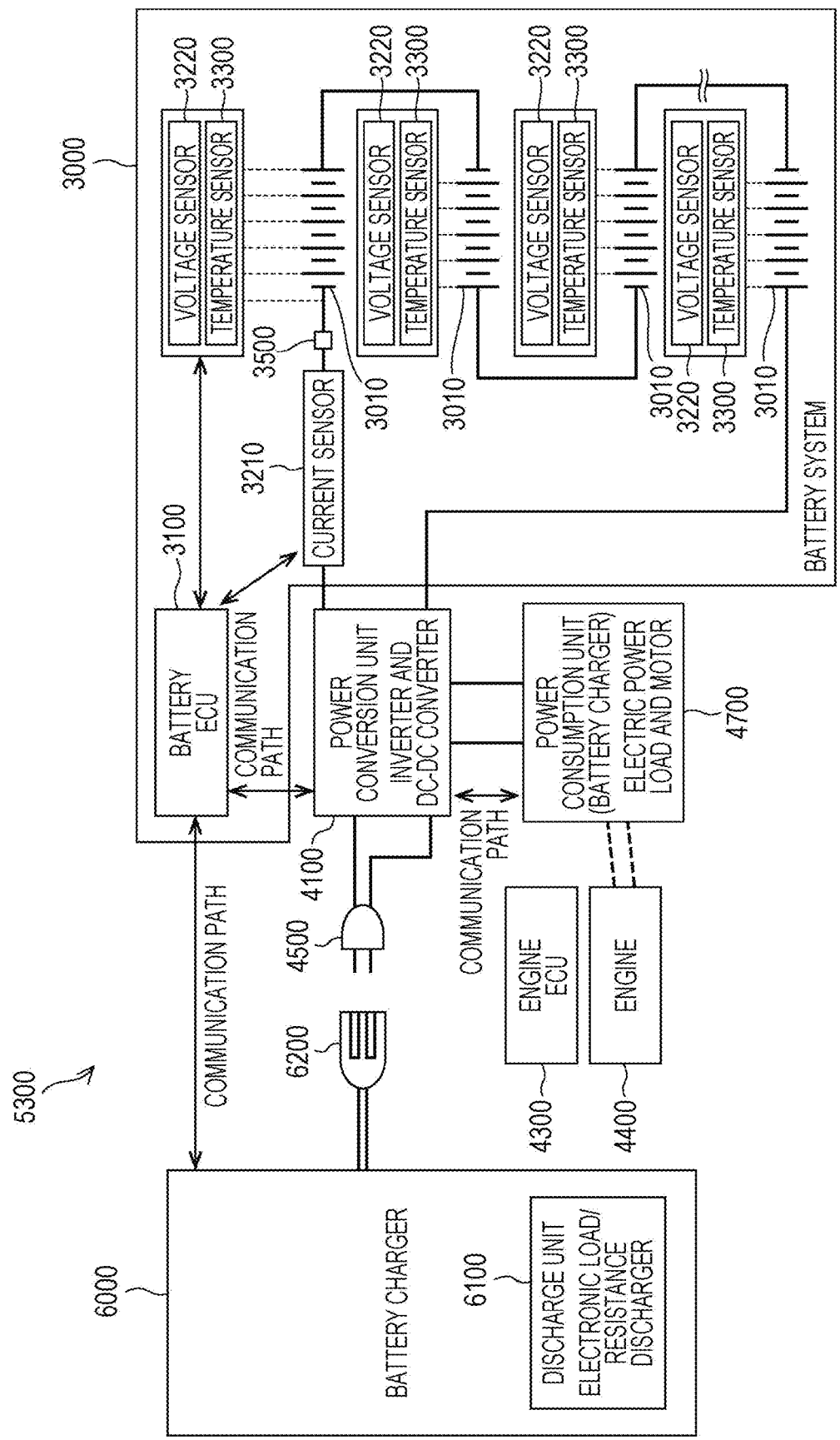
FIG. 17C is a block diagram for describing another example to which the battery system in the second embodiment is applied.

As illustrated in FIG. 17C, the battery system 3000 may be incorporated in a plug-in hybrid car (hereinafter sometimes referred to as an PHV) 5300. The PHV 5300 includes the battery system 3000, the power conversion twit 4100, the power consumption unit 4700, the engine ECU 4300, the engine 4400, and the connection unit 4500.

The secondary battery module 3010 in the PHV 5300 is capable of being charged with the battery charger 6000. The aspect of the charge in this case is the same as that of the charge from the battery charger 6000 to the secondary battery module 3010 in the EV 5100.

The battery system 3000 in the PHV 5300 is capable of supplying the power to the power consumption unit 4700. The aspect of the power supply in this ease is the same as that of the power supply from the battery system 3000 in the HV 5200 to the power consumption unit 4700.

The battery system 3000 in the PHV 5300 is capable of discharging the power to the battery charger 6000. The aspect of the power discharge in this case is the same as that of the power discharge from the battery system 3000 in the EV 5100 to the battery charger 6000.

The motor in the power consumption unit 4700 in the PHV 5300 is capable of performing the regeneration operation. The aspect of the regeneration operation in this case is the same as that of the regeneration operation of the motor in the power consumption unit 4700 in the MT 5200.

The secondary battery 10 in FIG. 1 may correspond to one secondary battery cell 3010 in FIG. 17A, FIG. 17B, and FIG. 17C. The secondary battery 10 may correspond to multiple secondary battery cells 3010. The secondary battery 10 may correspond t all the secondary battery cells 3010.

The control apparatus 100 in FIG. 1 may be realized by the battery ECU 3100 in FIG. 17A, FIG. 17B, and FIG. 17C. The recording unit 400 in FIG. 16 may be realized by the battery ECU 3100.

Figure 11:
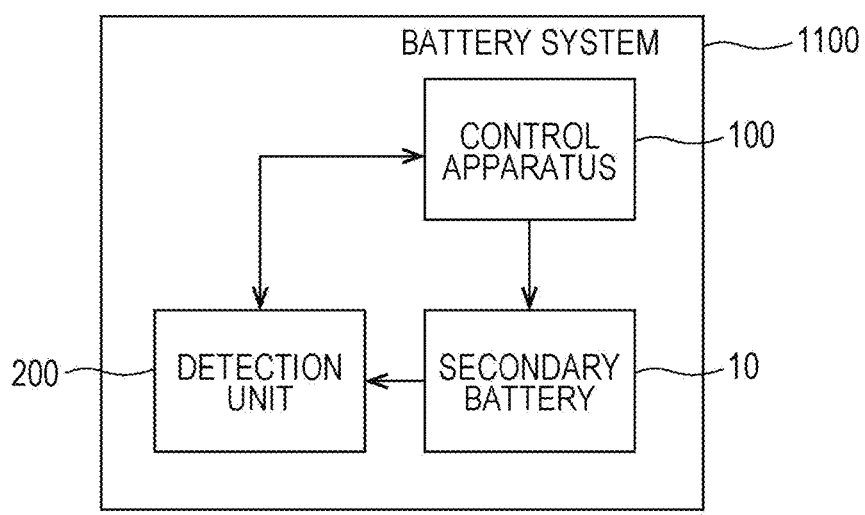
FIG. 11 is a block diagram illustrating an example of the schematic configuration of a battery system in the first embodiment.
Figure 12:
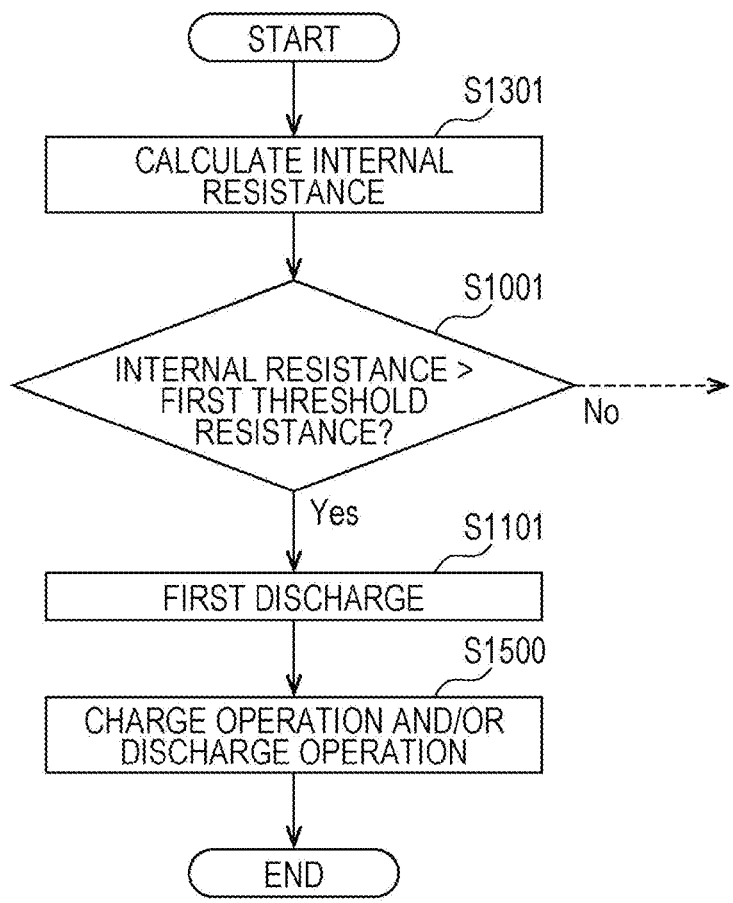
FIG. 12 is a flowchart illustrating an example of the control method in the first embodiment.

The detection unit 200 in FIG. 11 may include the current sensor 3210 in FIG. 17A, FIG. 17B and FIG. 17C. The detection unit 200 may include one voltage sensor 3220. The detection unit 200 may include multiple voltage sensors 3220. The detection unit 200 may include all the voltage sensors 3220.

Figure 15:
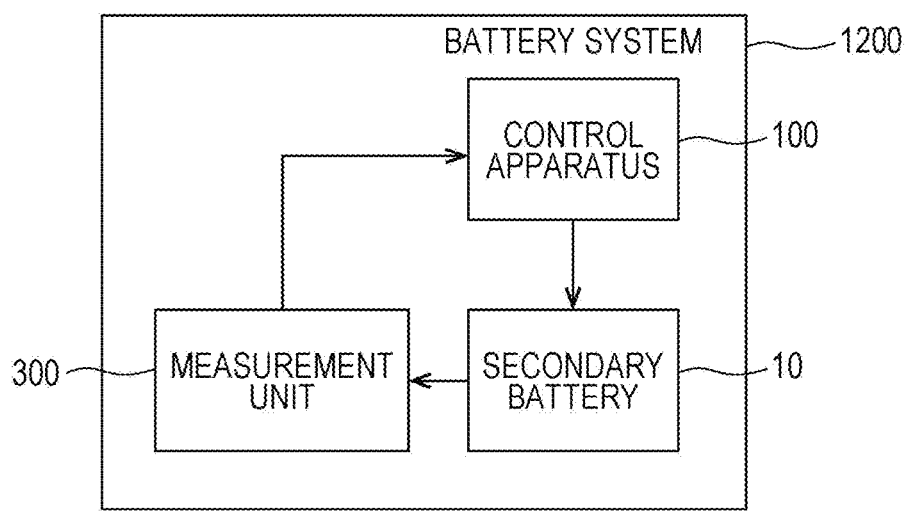
FIG. 15 is a block diagram illustrating an example of the schematic configuration of a battery system in the first embodiment.

The measurement unit 300 in FIG. 15 may include one temperature sensor 3300 in FIG. 17A. FIG. 17B, and FIG. 17C. The measurement unit 300 may include multiple temperature sensors 3300. The measurement unit 300 may include all the temperature sensors 3300.

In the examples hr FIG. 17A and FIG. 17C, when the first discharge is performed in the secondary battery module 3010, the discharged power may be consumed in the discharge unit 6100. In the examples in FIG. 17B and FIG. 17C, when the first discharge is performed in the secondary battery module 3010, the discharged power may be consumed in the electric power load in the power consumption unit 4700.

As apparent from FIG. 17A to FIG. 17C, the discharge unit functioning as the discharge destination of the power in the discharge of the secondary battery module 3010 may be included in the battery charger 6000 or may be included in the power consumption unit 4200 Of 4700, The battery charger functioning as the supply source of the power in the charge of the secondary battery module 3010 may be the battery charger 6000 or may be included in the power consumption unit 4200 or 4700. More generally, the discharge unit may be provided in the vehicle 5100, 5200, and 5300 or may be provided outside the vehicle 5100, 5200, and 5300. The same applies to the battery charger. In addition to the battery ECU 3100, an ECU, such as the engine ECU 4300, may be provided or may not be provided. An ECU may be provided at the battery charger 6000 side viewed from the connection unit 4500 and the connection unit 6200. The multiple secondary battery cells 3010 may not compose the assembled battery. Multiple secondary batteries may be provided or one secondary battery may be provided in the battery system 3000.

An exemplary process of the control method according to the second embodiment will now be described with reference to a flowchart in FIG. 18. A ease is described in which the control method is applied to the example in FIG. 17A, However, the control method is applicable to the examples in FIG. 17B and FIG. 17C.

Figure 18:
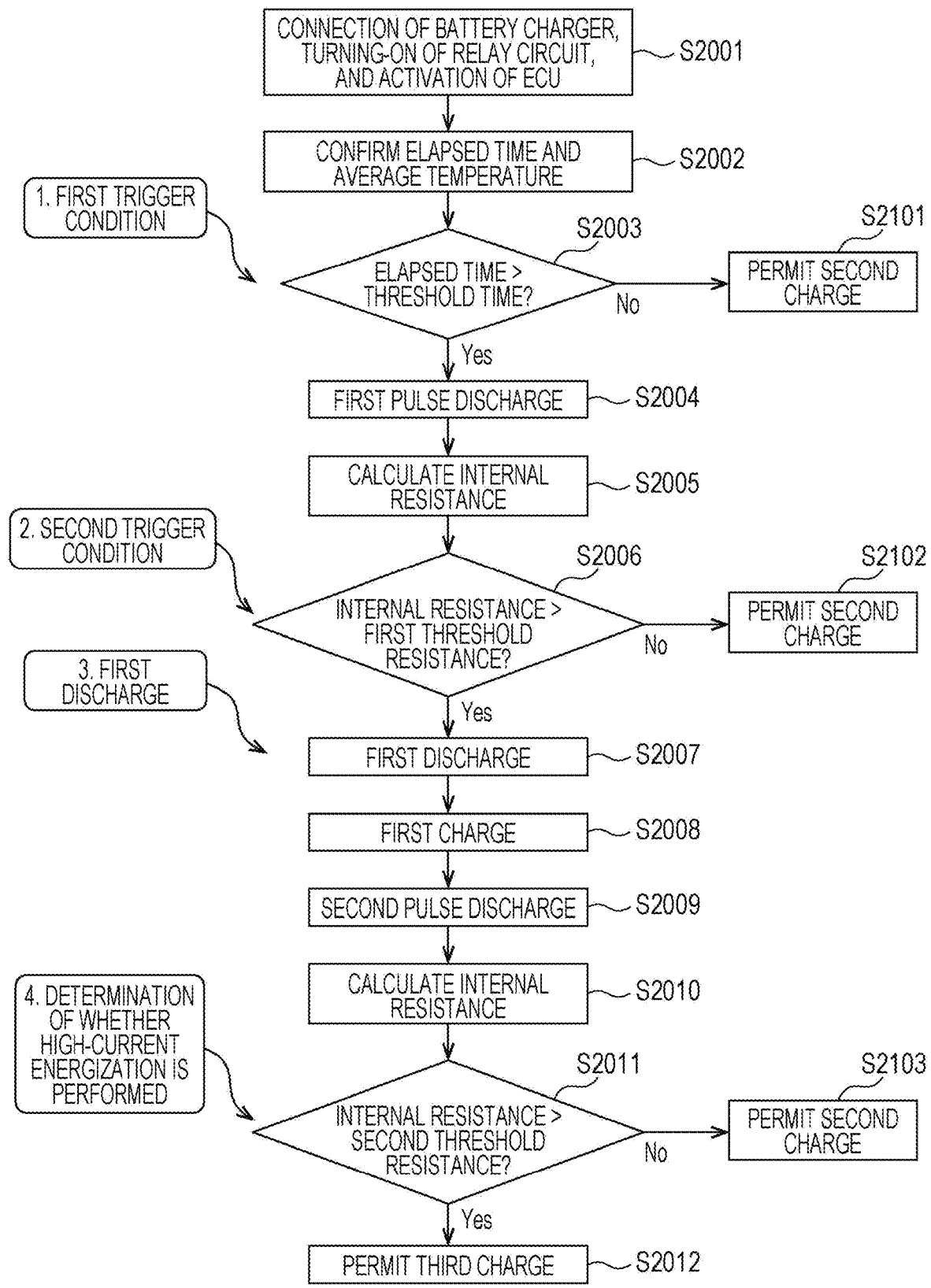
FIG. 18 is a flowchart illustrating an example of a control method in the second embodiment.

In the control method in FIG. 18, the high-current charge may be performed. As described above, performing the high-current charge when the internal resistance of the secondary battery is high easily forms the dendrite. In order to prevent the formation of the dendrite, the first discharge may be performed in the control method. The first discharge may decrease the internal resistance to suppress the formation of the dendrite. However, performing the first discharge means discharge of part of the energy in the secondary battery. Accordingly, the first discharge is performed when there is a great necessity for the first discharge in the control method. The necessity is determined based on a first trigger condition and a second trigger condition.

Referring to FIG. 18, in Step S2001, the battery charger 6000 is connected to the EV 5100 and the relay circuit 3500 is turned on to activate the battery ECU 3100.

In Step S2002, the control method confirms an elapsed time from the last time when the relay circuit 3500 is disconnected to the current moment and the average temperature of the secondary battery from the last time when the relay circuit 3500 is disconnected to the current moment. In this example, the elapsed time and the average temperature are recorded in the battery ECU 3100. After the confirmation, the process goes to Step S2003.

As described above, the secondary battery 10 in FIG. 1 may correspond to one secondary battery cell 3010. The secondary battery 10 may correspond to multiple secondary battery cells 3010. The secondary battery 10 may correspond to the entire secondary battery module 3010. Accordingly, the average temperature confirmed in Step S2002 may be the average temperature of one secondary battery cell 3010. The average temperature confirmed in Step S2002 may be the average value of the average temperatures of multiple secondary battery cells 3010. The average temperature continued in Step S2002 may be the average value of the average temperatures of all the secondary battery cells 3010. In sum, when the secondary battery 10 is composed on one secondary battery cell 3010, the average temperature of the secondary battery cell 3010 may be adopted as the average temperature in Step S2002. When the secondary battery 10 is composed of multiple secondary battery cells 3010, the average value of the average temperatures of the secondary battery cells 3010 may be adopted as the average temperature in Step S2002. When the secondary battery 10 is composed of multiple secondary battery cells 3010, the average temperature of one secondary battery cell 3010 may be acquired as a representative value and the representative value may be adopted as the average temperature in Step S2002.

(1. First Trigger Condition: Determination Based on Elapsed Time)

In Step S2003, the control method determines whether the elapsed time is longer than the threshold time. In this example, the threshold time is varied with the average temperature. The threshold time is reduced as the average temperature is increased. In a specific example, when the average temperature is 25° C., the threshold time is about three months. When the average temperature is 35° C., the threshold time is about one month. When the average temperature is 45° C., the threshold time is about 14 days. The battery system 3000 may have a constant table representing the correspondence between the average temperature and the threshold time. Specifically, the battery ECU 3100 may have the constant table. If the control method determines that the elapsed time is longer than the threshold time (YES in Step S2003), the process goes to Step S2004. If the control method determines that the elapsed time is not longer than the threshold time (NO in Step S2003), the process goes to Step S2101.

If the average temperature is abnormally high, the process may go to Step S2007 to perform the first discharge of the secondary battery cell 3010, specifically, of the secondary battery module 3010. For example, if the average temperature is higher than an abnormal threshold temperature, the first discharge may be performed. The abnormal threshold temperature is, for example, 5° C. or higher.

In Step S2004, the control method performs first pulse discharge of the secondary battery cell 3010. Specifically, the control method performs the first pulse discharge of the secondary battery module 3010. The frost pulse discharge is performed, for example, with current of 0.1 C rate or more for about two to ten seconds. A specific example of the discharge current of the first pulse discharge is 0.1 C rate to 1 C rate. Here, 1 C rate indicates current with which the secondary battery is frilly discharged for one hour. After the first pulse discharge, the process goes to Step S2005.

In Step S2005, the control method calculates the internal resistance of the secondary battery. The internal resistance is calculated, for example, using a measurement system in FIG. 13 and Equation (1) described above. The calculation of the internal resistance may be performed in the battery ECU 3100 or may be performed in the battery Charger 6000. After the calculation of the internal resistance, the process goes to Step S2006.

As described above, the secondary battery 10 in FIG. 1 may correspond to one secondary battery cell 3010. The secondary battery 10 may correspond to multiple secondary battery cells 3010. The secondary battery 10 may correspond to the entire secondary battery module 3010. Accordingly, the open circuit voltage OCV and the closed circuit voltage CCV of one secondary battery cell 3010 may be measured to calculate the internal resistance used in Step S2005 from the open circuit voltage OCV and the closed circuit voltage CCV. The open circuit voltage OCV and the closed circuit voltage CCV of one secondary battery cell 3010 may be identified, the internal resistance may be calculated from the open circuit voltage OCV and the closed circuit voltage CCV, the same measurement and calculation may be performed for the other secondary battery cells 3010, and the sum of the internal resistances may be adopted as the internal resistance in Step S2005. The sum of the internal resistances of all the secondary battery cells 3010 may be adopted as the internal resistance in Step S2005. The open circuit voltage OCV and the closed circuit voltage CCV of the secondary battery module 3010 composed of the multiple secondary battery cells may be identified, the internal resistance of the secondary battery module 3010 may be calculated from the open circuit voltage OCV and the closed circuit voltage CCV, and the internal resistance of the secondary battery module 3010 may be adopted as the internal resistance in Step S2005. In sum, when the secondary battery 10 is composed of one secondary battery cell 3010, the internal resistance of the secondary battery cell 3010 may be adopted as the internal resistance in Step S2005. When the secondary battery 10 is composed of multiple secondary battery cells 3010, the sum of the internal resistances of the secondary battery cells 3010 may be adopted as the internal resistance in Step S2005. When the secondary battery 10 is composed of multiple secondary battery cells 3010, the open circuit voltage OCV and the closed circuit voltage CCC of the secondary battery module 3010 composed of the secondary battery cells may be identified, the internal resistance of the secondary battery module 3010 may be calculated from the open circuit voltage OCV and the closed circuit voltage CCV, and the calculated internal resistance may be adopted as the internal resistance in Step S2005. When the secondary battery 10 is composed of multiple secondary battery cells 3010, the open circuit voltage OCV and the closed circuit voltage CCV of one secondary battery cell 3010 may be identified, the internal resistance of the secondary battery cell 3010 may be calculated from the open circuit voltage OCV and the closed circuit voltage CCV as a representative value, and the representative value may be adopted as the internal resistance in Step S2005.

(2. Second Trigger Condition: Determination Based on Internal Resistance of Battery)

In Step S2006, the control method determines whether the internal resistance calculated in Step S2005 is higher than the first threshold resistance. In this example, the first threshold resistance is varied with the average temperature and the amount of charge of the secondary battery. The first threshold resistance is decreased as the average temperature is increased. The first threshold resistance is decreased as the amount of charge of the secondary battery is increased. The battery system 3000 may have a constant table representing the correspondence between the average temperature and/or the amount of charge and the first threshold resistance. Specifically, the battery ECU 3100 may have the constant table. If the control method determines that the internal resistance is higher than the first threshold resistance (YES in Step S2006), the process goes to Step S2007. If the control method determines that the internal resistance is not higher than the first threshold resistance (NO in Step S2006), the process goes to Step S2102.

(3. First Charge)

In Step S2007, the control method performs the first discharge of the secondary battery cell 3010. Specifically, the control method performs the first discharge of the secondary battery module 3010. As apparent from FIG. 18, the first discharge is performed when there is a necessity for the first discharge from the determinations in 1 and 2. In this example, the discharge destination of the power of the first discharge is the discharge unit 6100 in the battery charger 6000. In this example, a certain quantity of electricity is discharged through the first discharge. The discharge current of the first discharge is, for example, 2 C rate. Increasing the discharge current to such an extent enables the internal resistance of the secondary battery cell 3010 to be decreased through the first discharge for a short time. However, the temperatures of the secondary battery cell 3010 and/or the discharge unit 6100 are likely to be increased when the discharge current is large. The discharge capacity of the discharge unit 6100 has an upper limit. The person skilled in the art is capable of setting the discharge current to an appropriate low value in consideration of the above problems. In this example, the capacity that is higher than 0% of the positive electrode capacity of the secondary battery cell 3010 and that is not higher than 25% thereof is discharged from the secondary battery cell 3010 through the first discharge. The internal resistance of the secondary battery cell 3010 is capable of being decreased for a short time in the above manner. The capacity that is 5% or more and 20% or less of the positive electrode capacity of the secondary battery cell 3010 may be discharged from the secondary battery cell 3010 through the first discharge. In a specific example, the capacity of 10% of the positive electrode capacity of the secondary battery cell 3010 is discharged from the secondary battery cell 3010 through the first discharge. In this example, the first discharge is terminated even if the amount of discharge does not reach a value that is set when the voltage of the secondary battery cell 3010 or the secondary battery module 3010 is decreased during the first discharge to reach the lower limit. After the first discharge, the process goes to Step S2008.

In Step S2008, the control method performs the first charge of the secondary battery cell 3010. Specifically, the control method performs the first charge of the secondary battery module 3010. The charge current of the first charge is smaller than the discharge current of the first discharge. Practically, the internal resistance ma not be sufficiently decreased even through the first discharge and the first charge may be performed in a state in which the temporal increase in the internal resistance is not sufficiently relieved. However, making the current value of the first charge lower than the current value of the first discharge enables the disadvantages in such a case to be reduced. The charge current of the first charge is, for example, 0.5 C rate. For example, the capacity that is higher than 0% of the positive electrode capacity of the secondary battery cell 3010 and that is not higher than 25% thereof is charged into the secondary battery cell 3010 through the first charge. The capacity that is 5% or more and 20% or less of the positive electrode capacity of the secondary battery cell 3010 may be charged into the secondary battery cell 3010 through the first charge. In a specific example, the capacity of 10% of the positive electrode capacity of the secondary battery cell 3010 is charged into the secondary battery cell 3010 through the first charge. After the first charge, the process goes to Step S2009.

In Step S2009, the control method performs second pulse discharge of the secondary battery cell 3010. Specifically, the control method performs the second pulse discharge of the secondary battery module 3010. The second pulse discharge is the same as the first pulse discharge in Step S2004. After the second pulse discharge, the process goes to Step S2010.

In Step S2010, the control method calculates the internal resistance of the secondary battery, as in Step S2005. After the calculation of the internal resistance, the process goes to Step S2011.

(4. Determination of Whether High-Current Energization is Performed)

In Step S2011, the control method determines whether the internal resistance calculated in Step 32010 is higher than the second threshold resistance. In this example, the second threshold resistance is varied with the average temperature and the amount of charge of the secondary battery described above. The second threshold resistance is decreased as the average temperature is increased. The second threshold resistance is decreased as the amount of charge of the secondary battery is increased. The battery system 3000 may have a constant table representing the correspondence between the average temperature and/or the amount of charge and the second threshold resistance. Specifically, the battery ECU 3100 may have the constant table. In this example, the second threshold resistance is equal to the first threshold resistance. If the control method determines that the internal resistance is higher than the second threshold resistance (YES in Step S2011), the process goes to Step S2012. If the control method determines that the internal resistance is not higher than the second threshold resistance (NO in Step S2011), the process goes to Step S2103.

In Step S2101, Step S2102, and Step S2103, the control method permits the second charge of the secondary battery cell 3010. In this example, the battery ECU 3100 transmits a signal to the battery charger 6000 to give the permission. After the permission the second charge of the secondary battery cell 3010 is performed. Specifically, the second charge of the secondary battery module 3010 is performed. In this example, the second charge is quick charge.

In Step S2012, the control method permits the third charge of the seconder battery cell 3010. In this example, the battery ECU 3100 transmits a signal to the battery charger 6000 to give the permission. After the permission, the third charge of the secondary battery cell 3010 is performed. Specifically, the third charge of the secondary battery module 3010 is performed. In this example, the third charge is the charge with'normal current. It is said that Step S2012 is a step to inhibit the quick charge. The charge current of the third charge is smaller than the charge current of the second charge.

According to the review by the inventor, the thickness of the SEI film on the negative electrode of the secondary battery is gradually increased during a time period in which the energization of the secondary battery is not performed. When the temperature of the secondary battery is high, the thickness is rapidly increased. When the temperature of the secondary battery is high, the thickness may reach a significant extent. According to the review by the inventor, the internal resistance of the secondary battery is varied in the following manner due to the variation in the thickness of the SEI film described above. The temporary increase in the internal resistance of the secondary battery is gradually increased during the time period in which the energization of the secondary battery is not performed. When the temperature of the secondary battery is high, the increase is rapidly increased. Accordingly, when the temperature of the secondary battery is high, the increase may reach a significant extent.

In the example in FIG. 18, the first trigger condition in Step S2003 is based on the elapsed time since the last time when the relay circuit 3500 is disconnected. The second trigger condition in Step S2006 is based on the internal resistance of the secondary battery. In consideration of the aspect of the variation in the thickness of the SEI film and the internal resistance described above, performing the first discharge based on the first trigger condition and the second trigger condition is appropriate for the first discharge when the internal resistance is increased in response to the increase in the thickness of the SEI film. This contributes to the first discharge that is performed at a timing when the internal resistance is capable of being effectively decreased.

In the example in FIG. 18, "4. Determination of whether high-current energization performed" is performed based on the internal resistance of the secondary battery. If the control method determines in Step S2011 that the internal resistance is higher than the second threshold resistance, it is considered that the high internal resistance is attributable to a cause other than the thickness of the SEI film.

In the example in FIG. 18, the determination based on the internal resistance is performed in Step S2006 and Step S2011. This enables the first discharge to be performed at a practical frequency. In addition, this avoids excessively prolonged control based on the flowchart in FIG. 18. However, if the internal resistance is apparently increased due to the thickness of the SEI film, part or all of Step S2006, Step S2011, and the calculation of the internal resistance related to the steps may be omitted.

EXAMPLES

The present disclosure will now be described in more detail using examples. However, the present disclosure is not limited to the examples described below.

First Example (1) Manufacturing of Positive Electrode

Lithium transition metal oxide (non-coordinating anion (NCA)) containing Li, Ni, Co, and Al was, prepared as the positive electrode active material. Acetylene black (AB) was prepared as a conductive material. Polyvinylidene fluoride (PVDF) was prepared as a binding material. Aluminum foil was prepared as a positive electrode current collector. The lithium transition metal oxide, the acetylene black, and the polyvinylidene fluoride were mixed. This mixture was performed at a mass ratio of NCA:AB:PVDF=95:2.5:2.5. An appropriate amount of N-Methyl-2-Pyrrolidone (NMP) was added to the mixture and the mixture having the N-Methyl-2-Pyrrolidone (NMP) added to was stirred. Positive electrode mixture slurry was prepared in the above manner. Next, after applying the positive electrode mixture slurry on both faces of the aluminum foil, the positive electrode mixture slurry was dried and the coating film of the positive electrode mixture was rolled using a roller. Finally, a multilayer body of the positive electrode current collector and the positive electrode mixture was cut into a certain electrode size. The positive electrode having a positive electrode mixture layer on both faces of the positive electrode current collector was manufactured in the above manner.

(2) Manufacturing of Negative Electrode

Electrolytic copper foil having a thickness of 10 μm was prepared. The electrolytic copper foil was cut into a certain electrode size. The negative electrode was manufactured in the above manner.

(3) Preparation of Non-Aqueous Electrolyte

Ethylene carbonate (EC) was mixed with dimethyl carbonate (DMC). This mixture was performed at a volume ratio of EC:DMC=3:7. $LiB(C_6F_5)_4$ and $LiPF_6$ were dissolved into the mixed solvent so as to be 0.5 mol/L and 1 mol/L, respectively. The liquid non-aqueous electrolyte was prepared in the above warmer.

(4) Manufacturing of Battery

A polyethylene thin film was prepared as a separator. A bag-shaped exterior body formed of a laminate sheet having an Al layer was prepared. A tab made of Al was mounted to the positive electrode manufactured in (1). A tab made of Ni was mounted to the negative electrode manufactured in (2). The positive electrode and the negative electrode were spirally wound with the polyethylene thin film interposed therebetween in inert gas atmosphere. The wound electrode body was manufactured in the above manner. The manufactured electrode body was housed in the exterior body, the non-aqueous electrolyte prepared in (3) was injected, and, then, the exterior body was sealed. The lithium secondary battery was manufactured in the above manner.

The lithium secondary battery manufactured in (4) was left for long-term storage. Specifically, the lithium secondary battery was left in atmosphere at 55° C. for six or more days and, then, was left at room temperature, that is, in atmosphere at 25° C. for one or more hours. The internal resistance of the lithium secondary battery before being left and the internal resistance of the lithium secondary battery after being left were measured. As indicated in Table 1, the percentage of the internal resistance after being left to the internal resistance before being left was 208%. It was confirmed that the internal resistance is increased by 107% through the storage at 55° C. It is considered that the increase in the internal resistance was caused by the increase in the thickness of the SEI film on the negative electrode of the secondary battery. The measurement of the internal resistance was performed using the measurement system in FIG. 13 and Equation (1). The same applies to Second example and First comparative example described below.

TABLE 1

| | Internal resistance ratio of battery (%) |
|---|---|
| Before being left | 100 |
| After being left | 208 |

The battery after the storage at 55° C. and at room temperature was discharged at 2 C rate for 270 seconds. The discharge here corresponds to the first discharge. Next, the battery was charged at 0.5 C rate for 1,080 seconds. The charge here corresponds to the first charge. The charge state of the battery was returned to the charge state immediately after being left in the above manner. Tu other words, the SOC of the battery was returned to the SOC at the time when the first discharge is started. Next, a test simulating the high-current charge was performed to the battery. Specifically, the battery was charged at a current value of 2 C rate for 30 seconds. The charge here corresponds to the second charge. The voltage of the battery during the charge was measured and recorded.

Second Example

The battery manufactured in the same procedure as in First example was left in atmosphere at 55° C. for seven or more days and, then, was left at room temperature, that is, in atmosphere at 25° C. for one or more hours. The percentage of the internal resistance after being left to the internal resistance before being left exceeded 100%. It is considered also in the battery in Second example that the thickness of the SEI film on the negative electrode of the secondary battery was increased through being left, as in the battery in First example. The battery after being left was discharged at 2 C rate for 270 seconds. The discharge here corresponds to the first discharge. Next, the battery was charged at 2 C rate for 30 seconds. The charge here corresponds to the second charge. The voltage of the battery during the charge was measured and recorded.

First Comparative Example

The battery manufactured in the same procedure as in First example was left in atmosphere at 55° C. for seven or more days. The percentage of the internal resistance after being left to the internal resistance before being left exceeded 100%. It is considered also in the battery in First comparative example that the thickness of the SEI film on the negative electrode of the secondary battery was increased through being left, as in the battery in First example. The battery after being left was further left at room temperature, that is, in atmosphere at 25° C. for one hour or more. After being left, the battery was immediately charged at 2 C rate for 30 seconds. The charge here corresponds to the second charge. The voltage of the battery during the charge was measured and recorded.

The difference between the open circuit voltage OCV and the closed circuit voltage CCV of the battery after one second elapsed since the second charge was started was measured for First example, Second example, and First comparative example. Table 2 indicates the differences. The percentages of the differences of First example, Second example, and First comparative example with respect to the difference in First comparative example are also indicated in Table 2.

It is considered that the positive electrode resistance, is slightly varied in the conditions of being left in First example, Second example, and First comparative example. Accordingly, the small difference in Table 2 indicates that the increase in the internal resistance in the formation of the SEI film is large. This also indicates that the negative electrode potential during the second charge has a large transient decrease.

The difference was decreased by 45 mV or more and the percentage was decreased by 30% or more in First example, compared with those in First comparative example. The difference was decreased by 24 mV or more and the percentage was decreased by 16% or more in Second example, compared with those in First comparative example. These results indicate that the increase in the internal resistance and the transient decrease in the negative electrode potential are reduced through the first discharge.

TABLE 2

| | Increase in voltage After one second (V) | Increase in voltage After one second (%) |
| --- | --- | --- |
| First example | 0.106 | 70 |
| Second example | 0.127 | 84 |
| First comparative example | 0.151 | 100 |

(Verification Test and so on)

As described above, when the negative electrode potential of the lithium secondary battery is low, the dendrite is likely to be formed during charge. The inventor performed a first verification test to confirm the above fact. Specifically, the electrolyte solution and the positive electrode of a commercially available lithium ion battery was combined with a lithium metal negative electrode to manufacture two lithium secondary batteries. One lithium secondary, battery was charged with the normal current. The other lithium secondary battery was charged with current four times larger than the normal current.

Figure 19A:
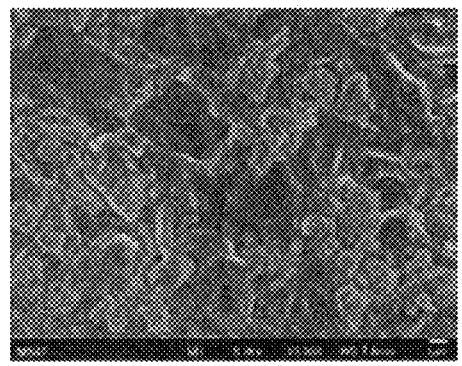
FIG. 19A is an electron microscope photograph of a surface of lithium metal after a lithium secondary battery is charged with normal current.
Figure 19B:
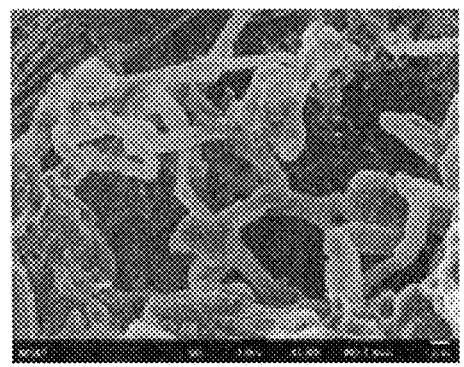
FIG. 19B is an electron microscope photograph of the surface of lithium metal after the lithium secondary battery is charged with high current.

FIG. 19A illustrates an image of the lithium metal negative electrode of the lithium secondary battery charged with the normal current, which was captured by an electron microscope. FIG. 19B illustrates an image of the lithium metal negative electrode of the lithium secondary battery charged with the current four times larger than the normal current, which was captured by the electron microscope. The images in FIG. 19A and FIG. 19B were captured at 5,000-fold magnification. Since the charge current in the latter charge is larger than that in the former charge, the decrease in the negative electrode potential is large in the latter charge. As illustrated in FIG. 19A and FIG. 19B, needle-like bodies notably occur in the latter charge, compared with those in the former charge. This indicates that the large decrease in the negative electrode potential easily increases the dendrite lithium metal.

The decrease in the negative electrode potential during charge of the secondary battery is reduced as the charge current is reduced. Japanese Published Unexamined Patent Application No. 9-326252 (Patent Document 2) describes suppression of the dendrite by setting the charge current to 0.5 mA/cm$^2$ or less. However, this increases the time to perform the charge to degrade the user-friendliness of the secondary battery. In consideration of this, it is desirable to reduce the decrease in the negative electrode potential using another approach.

The inventor has considered that the decrease in the negative electrode potential is reduced by decreasing the internal resistance of the secondary battery. The inventor has found that the internal resistance of the secondary battery can be temporarily increased through the consideration.

The inventor made a hypothesis that the SEI film formed on the negative electrode leads the state in which the internal resistance of the secondary battery is temporarily increased and the state is relieved or cleared through the discharge of the secondary battery. Specifically, the inventor made the following hypothesis: the secondary battery is left in high-temperature atmosphere or is left for a long time. The thickness of the SEI film on the surface of the negative electrode is increased through being left. Due to the increase in the thickness, it is difficult for ions to move to the electrode during charge and discharge. This leads the state in which the internal resistance is temporarily increased. Performing the discharge of the secondary battery in this state drops off part of the SEI film or the entire SEI film, which is formed on the surface of the negative electrode. This relieves or clears the state in which the internal resistance of the secondary battery is temporarily increased.

The inventor performed a second verification test in order to verity the hypothesis that the state in which the internal resistance of the secondary battery is temporarily increased is relieved or cleared through discharge. In the second verification test, a lithium secondary battery similar to the lithium secondary battery used in the first verification test was manufactured. This lithium secondary battery may be hereinafter referred to as a sample A. In the second verification test, the electrolyte solution and the positive electrode of a commercially available lithium ion battery was combined with a graphite negative electrode to manufacture another lithium secondary battery. This secondary battery may be hereinafter referred to as a sample B.

The capacity of the sample A and the capacity of the sample B were measured. After the measurement of the capacities, the voltage of the sample A and the voltage of the sample B were adjusted to voltages at which the amounts of charge are 50% of the positive electrode capacity. In other words, the voltages were adjusted to voltages at which the SOC is 50%. After the adjustment, the internal resistances of the sample A and the sample B were measured using the measurement system in FIG. 13 and Equation (1).

Next, the sample A and the sample B were left in atmosphere at 45° C. for 30 days or more. It is considered that the thickness of the SEI film on the negative electrode of the secondary battery was increased through being left. Then, the internal resistances of the sample A and the sample B were measured using the measurement system in FIG. 13 and Equation (1).

Next, the sample A and the sample B were fully discharged. After the discharge, the sample A and the sample B were charged. The charge states of the sample A and the sample B were returned to the original states through the charge. In other words, the SOCs of the sample A and the sample B were returned to the SOCs at the time when the discharge is started through the charge. Then, the internal resistances of the sample A and the sample B were measured using the measurement system in FIG. 13 and Equation (1).

The ratio of the internal resistance after the charge to the internal resistance before the discharge was calculated for the sample A and the sample B. The results of calculation are indicated in Table 3.

TABLE 3

| Sample | Ratio (%) |
| --- | --- |
| A (lithium metal negative electrode) | 46 |
| B (graphite negative electrode) | 84 |

In the sample A, the ratio between the internal resistances was 46%. In other words, the internal resistance was decreased by 54% after the discharge and the charge in the sample A. In the sample B, the ratio between the internal resistances was 84%. In other words, the internal resistance was decreased by 16% after the discharge and the charge in the sample B. This result indicates that, when the negative electrode is the lithium metal negative electrode, the internal resistance may be greatly decreased, compared with the case in which the negative electrode is the graphite negative electrode.

In the sample A, the internal resistance at the time when the charge is terminated was much lower than that at the time when the discharge is started. It is considered that this is because the amount of the SEI film on the surface of the negative electrode, which has dropped off through the discharge, is greater than the amount of the SEI film re-formed on the surface of the negative electrode through the charge and the SEI film that is re-formed is thinner than that before the SEI film is dropped off.

Specifically it is considered in the sample A that the lithium metal negative electrode was dissolved into the electrolyte solution through the discharge and the SEI film on the surface of the negative electrode as dropped off with the dissolution to greatly decrease the internal resistance. In contrast, it is considered in the sample B that it was difficult for the SEI film formed on an edge face of the graphite to be eluted into the electrolyte solution and this kept a slight decrease in the internal resistance.

Next, a third verification test was performed to verify the relationship between the amount of discharge and the degree of relief of the temporary increase in the internal resistance. Specifically, a lithium secondary battery similar to the lithium secondary battery used in the first verification test was manufactured. The lithium secondary battery was charged to a full charge state. Then, the lithium secondary battery was left at room temperature, that is, at 25° C. for one month.

After being left, the lithium secondary battery was discharged. Then, the lithium secondary battery was charged. This returned the charge state of the lithium secondary battery to the original charge state. In other words, the SOCs of the sample A and the sample B were returned to the SOCs at the time when the discharge is started through the charge.

The internal resistance at the time when the charge is terminated was lower than the internal resistance at the time when the discharge is started. However, the decrease in the internal resistance was varied with the amount of discharge. Specifically, in the third verification test, the amount of discharge and the amount of charge were varied within a range from 5% to 40% of the positive electrode capacity. The internal resistance exhibited the maximum decrease when the amount of charge is 40%. Table 4 indicates the decrease in the internal resistance for each amount of discharge provided that the decrease in the internal resistance when the amount of discharge is 40% is 100%.

TABLE 4

| | Amount of discharge (SOC %) | | | | | | | | |
| --- | --- | --- | --- | --- | --- | --- | --- | --- | --- |
| | 0.0 | 5 | 10 | 15 | 20 | 25 | 30 | 35 | 40 |
| Decrease in internal resistance (%) | 0.0 | 45 | 65 | 75 | 83 | 88 | 92 | 96 | 100 |

Table 4 indicates that the decrease in the internal resistance is increased as the amount of discharge is increased. In contrast, Table 4 indicates that the effect of decreasing the internal resistance is increasingly saturated as the amount of discharge is increased. In consideration of this, the amount of discharge is desirably set to, for example, 25% or less, specifically, 5% to 20%.

(Exemplary Configuration of Secondary Battery)

An exemplary configuration of the lithium secondary battery adoptable as the secondary battery according to an embodiment of the present disclosure will now be described.

[Non-Aqueous Electrolyte]

The non-aqueous electrolyte contains one or more kinds of lithium salt. The non-aqueous electrolyte may be in a liquid form or in a gel form. The non-aqueous electrolyte in a liquid form contains, for example, the lithium salt and non-aqueous solvent with which the lithium salt is to be dissolved. The non-aqueous electrolyte in a gel form contains, for example, the lithium salt and matrix polymer or the lithium salt, the non-aqueous solvent, and the matrix polymer. The matrix polymer is, for example, a material that absorbs the non-aqueous solvent and turns the non-aqueous solvent into gel and is exemplified by fluorocarbon resin, acrylic resin, polyether resin, or the like.

The lithium salt is, for example, $LiBF_4$, $LiClO_4$, $LiPF_6$ (lithium hexafluorophosphate), $LiAsF_6$, $LiSbF_6$, $LiAlCl_4$, $LiSCN$, $LiCf_3SO_3$, $LiCF_3CO_2$, $LiN(SO_2CF_3)_2$ (lithium bistrifluoromethylsulphonyl imide), imide salts including LiN$(C_mF_{2m+1}SO_2)_x$ $(C_nF_{2n+1}SO_2)_y$ (each of m and n is an integer of 0 or 1 or more, each of x and y is 0, 1, or 2, and x+y=2), lithium salt using oxalate complex as anion, $LiB(C_6H_5)_4$, $LiB(C_6H_3F_2)_4$, $LiB(C_6F_5)_4$, or $LiB(C_6H_3(C_6H_3(CF_3)_2)_4$.

(Non-Aqueous Solvent)

The non-aqueous solvent is, for example, ester, ether, nitrile (for example, acetonitrile), or amide (for example, dimethylformaide). One of them is used alone or two or more of them are combined for usage. The non-aqueous solvent may be a halogen substitution product in which at least part of hydrogen is replaced with halogen atoms, such as fluorine.

The ester is, for example, cyclic carbonate ester, such as ethylene carbonate (EC), propylene carbonate (PC), butylene carbonate, or fluoroethylene carbonate (FEC); Chain carbonate ester, such as dimethyl carbonate (DMC), ethyl methyl carbonate (EMC), diethyl carbonate (DEC), methyl propyl carbonate, ethyl propyl carbonate, or methyl isopropyl carbonate; cyclic carboxylic ester, such as γ-butyrolactone or γ-valerolactone; or chain carboxylic ester, such as methyl, acetate, ethyl acetate, propyl acetate, methyl propionate (MP), ethyl propionate, or methyl fluoropropionate (FMP).

The ether is, for example, cyclic ether, such as 1,3-dioxolane, 4-methyl-1,3-dioxolane, tetrahydrofuran, 2-methyl tetrahydrofuran, propylene oxide, 1,2-butylene oxide, 1,3-dioxane, 1,4-dioxane, 1,3,5-trioxane, furan, 2-methyl furan, 1,8-cineole, or crown ether; or chain ether, such as 1,2-dimethoxyethane, diethyl ether, dipropyl ether, diisopropyl ether, dibutyl ether, dihexyl ether, ethyl vinyl ether, butyl vinyl ether, methyl phenyl ether, ethyl phenyl ether, butyl phenyl ether, pentyl phenyl ether, methoxytoluene, benzyl ethyl ether, diphenyl ether, dibenzyl ether, o-dimethoxybenzene, 1,2-diethoxyethane, 1,2-dibutoxyethane, diethylene glycol dimethyl ether, diethylene glycol diethyl ether, diethylene glycol dibutyl ether, 1,1-dimethoxymethane, 1,1-diethoxyethan, triethylene glycol dimethyl ether, or tetraethylene glycol dimethyl ether.

The non-aqueous electrolyte may contain an additive agent. The additive agent may be a compound that decomposes at potential lower than that of a lithium boron compound. Further forming a film caused by the additive agent on a film caused by the lithium boron compound increases the uniformity of the SEI film. This enables the formation of the dendrite to be easily suppressed to further improve the discharge capacity and the characteristics. Such an additive agent is, for example, vinylene carbonate (VC), fluoroethylene carbonate (FEC), or vinyl ethyl carbonate (VEC). One of them is used alone or two or ore of them are combined for usage.

[Negative Electrode]

The negative electrode is an electrode into which the lithium metal is precipitated during charge. The lithium metal is mainly precipitated onto the surface of the negative electrode, which is opposed to the positive electrode. The lithium metal that is precipitated is caused by the lithium ions in the non-aqueous electrolyte and is dissolved into the non-aqueous electrolyte again through discharge.

The negative electrode is made of, for example, metallic lithium and/or lithium alloy. Alternatively, the negative electrode may include a negative electrode current collector made of a conductive material other than the metallic lithium and/or the lithium alloy. In this case, a negative electrode active material layer including the lithium metal may be formed on at least a face of the negative electrode current collector, which is opposed to the positive electrode. The negative electrode active material layer is formed through, for example, attachment of foil lithium metal or electrodeposition or vapor deposition of the lithium metal. In this case, the capacity of the lithium metal negative electrode to be formed is desirably within 200% of the positive electrode capacity to achieve the high capacity density.

However, in the full discharge state of the battery, the negative electrode may not contain the lithium metal that is substantially dischargeable. This is because the volume energy density of the battery is increased. In other words, the negative electrode may not include the negative electrode active material layer in the full discharge state while including the negative electrode current collector described above. In this case, the negative electrode is composed of only the negative electrode current collector after the discharge of the battery and the lithium metal is precipitated onto the surface of the negative electrode current collector through the charge to form the negative electrode active material layer, which is a lithium metal layer.

The full discharge state of the battery is a state in which the lithium secondary battery is discharged to the minimum voltage in a predetermined voltage range in the device fields in which the lithium secondary battery is used. Not-including of the lithium metal that is substantially dischargeable in the negative electrode in the full discharge state is capable of being checked in the following manner. For example, the lithium secondary battery in the full discharge state is decomposed to take out the negative electrode, the negative electrode is washed in the non-aqueous solvent, such as ester, and the negative electrode is dried. A test battery including the above negative electrode and the lithium metal serving as the other electrode is manufactured and, if the negative electrode is not capable of discharging, the negative electrode is in the full discharge state.

[Negative Electrode Current Collector]

The negative electrode current collector is made of a conductive material other than the metallic lithium and/or or the lithium alloy. In particular, the negative electrode current collector may be made of a metallic material that does not react with the lithium metal. No-reaction of the negative electrode current collector with the lithium metal indicates that the negative electrode current collector does not form alloy or an intermetallic compound with the lithium metal.

Such a metallic material is, firm example, copper (Cu), nickel (Ni), iron (Fe), or stainless steel (SUS). The metallic material may be Cu in terms of the conductivity.

A mode of the negative electrode current collector is, for example, a porous sheet or a non-porous sheet. Such a sheet is exemplified by, for example, a foil or a film. When copper foil is used as the negative electrode current collector, the main component of the copper foil may be Cu. The copper foil having Cu as the main component indicates that Cu occupies 50 percent by mass or more of the copper foil. When the copper foil is used as the negative electrode current collector, the copper foil may be substantially composed of only Cu. The thickness of the negative electrode current collector is not especially limited and is, for example, 5 µm to 20 µm.

(Protective Layer)

The negative electrode may have a protective layer at least on the face opposed to the positive electrode. The protective layer contains at least one selected from a group composed of solid electrolyte, an organic material, and an inorganic material. This facilitates uniform reaction on the surface of the negative electrode to farther suppress the formation of the dendrite.

The solid electrolyte is, for example, sulfide solid electrolyte, phosphate solid electrolyte, perovskite-type solid electrolyte, or garnet-type solid electrolyte.

The sulfide solid electrolyte contains a sulfur component and has the conductivity to the lithium ions. The sulfide solid electrolyte is a compound containing, for example, lithium (Li), sulfur (S), and a third component (A). The third component (A) is, for example, phosphorus (P), germanium (Ge), boron (B), silicon (Si), iodine (I), aluminum (Al) gallium (Ga), or arsenic (As). One of them is used alone or two or more of them are combined for usage. Specific examples of the sulfide solid electrolyte include $Li_2S$—$P_2S_5$ ($Li_2S$: 50 mol %, $P_2S_5$: 50 mol %), $70Li_2S$-$30P_2S_5$ ($Li_2S$: 70 mol %, $P_2S_5$: 30 mol %), $80Li_2S$-$20P_2S_5$ ($Li_2S$: 80 mol % $P_2S_5$: 20 mol %), $Li_2S$—$SiS_2$ ($Li_2S$: 50 mol %, $SiS_2$: 50 mol), and $LiGe_{0.25}P_{0.75}S_4$.

The phosphate solid electrolyte contains a phosphate component and has the conductivity to the lithium ions. Specific examples of the phosphate solid electrolyte include, a phosphate compound including lithium, such as $Li_{1+X}Al_XTi_{2-X}(PO_4)_3$ (0<X<2) and $Li_{1+Y}Al_YGe_{2-Y}(PO_4)_3$ (0<Y<2). X and Y may be 0<X≤1 and 0<Y≤1. More specifically, the phosphate solid electrolyte is exemplified by $Li_{1.5}Al_{0.5}Ti_{1.5}(PO_4)_3$.

The garnet-type solid electrolyte is a compound having a garnet-type crystal structure and is generally represented by a composition formula $A_3B_2C_3O_{12}$. The garnet-type solid electrolyte is, for example, composite oxide containing Li, lanthanum(La), and zirconium (Zr), such as lithium lanthanum zirconate. Specifically, the garnet-type solid electrolyte is exemplified by $Li_7La_3Zr_2O_{12}$.

The perovskite-type solid electrolyte is a compound having a perovskite-type crystal structure and is generally represented by a composition formula $ABO_3$. The perovskite-type solid electrolyte is, for example, composite oxide containing Li, La, and titanium (Ti), such as lithium lanthanum titanate. Specifically, the perovskite-type solid electrolyte is exemplified by $(LaLi)TiO_3$ or $La_{1-3x}Li_{3x}TiO_3$.

The organic material is exemplified by lithium conductive polymer, such as polyethylene oxide or methyl poly methacrylate. The inorganic material is exemplified by a ceramic material, such as $SiO_2$, $Al_2O_3$, or magnesium oxide (MgO).

The protective layer may contain the garnet-type solid electrolyte. In particular, the protective layer may contain $Li_7La_3Zr_2O_{12}$. The protective layer may contain the phosphate solid electrolyte. In particular, the protective layer may contain the phosphate compound containing lithium.

[Positive Electrode]

The positive electrode includes, for example, the positive electrode current collector and the positive electrode mixture layer formed on the positive electrode current collector. The positive electrode mixture layer contains, for example, the positive electrode active material, the conductive material, and the binding material. The positive electrode mixture layer may be formed on both faces of the positive electrode current collector. The positive electrode is manufactured by, for example, applying the positive electrode mixture slurry containing the positive electrode active material, the conductive material, and the binding material on both faces of the positive electrode current collector, drying the coating film, and rolling the coating The positive electrode active material is a material that occludes and discharges the lithium ions. The positive electrode active material is, for example, the lithium transition metal oxide, transition metal fluoride, polyanion, fluorinated polyanion, or transition metal sulfide. The positive electrode active material may be the lithium transition metal oxide in terms of the inexpensive manufacturing cost and the high average discharge voltage.

Metallic elements composing the lithium transition metal oxide may include, for example, magnesium (Mg), Al, calcium (Ca), scandium (Se), Ti, vanadium (V), chromium (Cr), manganese (Mn), Fe, cobalt (Co), Ni, Cu, zinc (Zn), Ga, Ge, yttrium (Y), Zr, tin (Sn), antimony (Sb), tungsten (W), lead (Pb), and bismuth (Bi). The metallic elements may include Co, Ni, Mn, and Al. One of them is used alone or two or more of them are combined for usage.

The conductive material is, for example, a carbon material, such as carbon black (CB), acetylene black (AB), Ketjenblack, carbon nanotube (CNT), or graphite. The binding material is, for example, fluorocarbon resin such as polytetrafluoroethylene (PTFE) or polyvinylidene fluoride (PVDF), polyacrylonitrile (PAN), polyimide resin, acrylic resin, or polyolefin resin. One of them is used alone or two or more of them are combined for usage.

The material of the positive electrode current collector is, for example, a metallic material, such as Al, SUS, Ti, or alloy of them. The above material may be Al or Al alloy because the material is inexpensive and it is easy for the material to be thinned. A mode of the positive electrode current collector is, for example, a porous sheet or a non-porous sheet. The sheet made of the metallic material is exemplified by, for example, a metal foil, a metal film, or a metal mesh. The carbon material, such as carbon, may be applied on the surface of the positive electrode current collector. This holds the promise of, for example, decreasing the resistance value, giving a catalytic effect, and enhancing the bonding between the positive electrode mixture layer and the positive electrode current collector.

[Separator]

A porous sheet having ion per and insulation is used as the separator. The porous sheet, is, for example, a microporous thin film, a woven fabric, or a non-woven fabric. Although the material of the separator is not particularly limited, the material of the separator may be polyethylene, olefin resin such as copolymer of polypropylene, ethylene, and propylene, cellulose, or the like. The separator may be a multilayer body of porous sheets. For example, the separator may be a multilayer body of the non-woven fabric made of cellulose fiber and the non-woven fabric made of thermoplastic resin fiber or may be a multilayer body of a polyethylene thin film and a polypropylene thin film. Polyamide resin may be applied on the surface of the separator. This may improve the durability of the separator. In addition, a heat resistant layer containing inorganic filler may be formed on the interface between the separator and the positive electrode and/or the interface between the separator and the negative electrode.

[Specific Example of Configuration of Lithium Secondary Battery]

Figure 20:
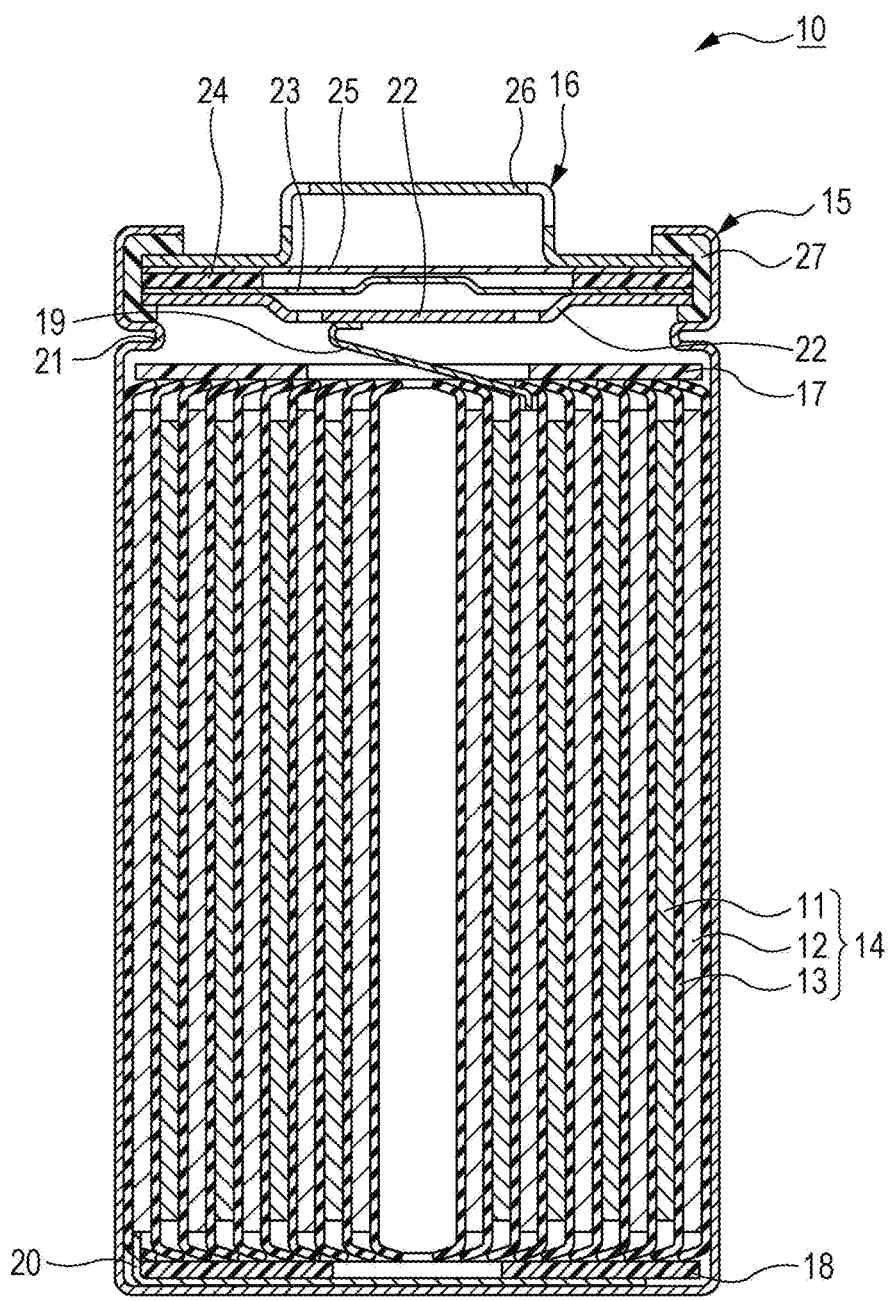
FIG. 20 is a longitudinal cross-sectional view of an example of the lithium secondary battery.
Figure 21:
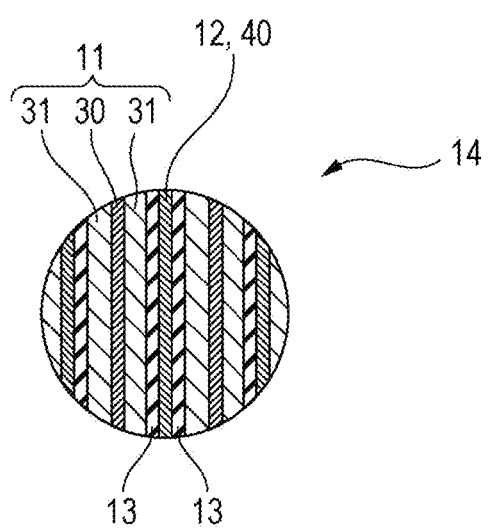
FIG. 21 is a cross-sectional view of an example of an electrode body.

A specific example of the configuration of a lithium secondary battery will now be described with reference to the drawings. FIG. 20 is a longitudinal cross-sectional view of a lithium secondary battery 10, which is an example in an embodiment. FIG. 21 is a cross-sectional view illustrating the configuration of an electrode body 14, which is an example of the embodiment. In the lithium secondary battery 10, the lithium metal is precipitated onto a negative electrode 12 during charge and the lithium metal is dissolved into the non-aqueous electrolyte (not illustrated) during discharge.

The lithium secondary battery 10 is a cylindrical battery having a cylindrical metallic battery case. However, the shape of the lithium secondary battery of the embodiments of the present disclosure is not limited to this. The shape of the lithium secondary battery may be appropriately selected depending its application and so on. For example, the lithium secondary battery may be, for example, a coin battery, a rectangular battery having a rectangular metallic case, or a laminated battery having an exterior body formed of a laminate sheet or the like including an Al layer.

The battery case is composed of the case main body 15 and a sealing body 16. The electrode body 14 and the non-aqueous electrolyte are housed in the battery case. A gasket 27 is arranged between the case main body 15 and the sealing body 16 to ensure the sealability in the battery case.

The case main body 15 is a cylindrical metallic, container with a bottom. The case main body 15 has a step 21 formed by, for example, pressing the side wall of the case main body 15 from the outside. The step 21 may be formed in a ring shape along the circumferential direction of the case main body 15. In this case, the sealing body 16 is supported by the top face of the step 21.

The sealing body 16 is formed by sequentially laminating a filter 22, a lower valve body 23, an insulating member 24, an upper valve body 25, and a cap 26 from the inside of the battery case. Each member described above has, for example, a circular plate shape or a ring shape. The lower valve body 23 and the upper valve body 25 are connected to each other in their central portions, and the insulating member 24 is sandwiched between the peripheral portions of the lower valve body 23 and the upper valve body 25. The filter 22 and the lower valve body 23 are connected to each other in their central portions. The upper valve body 25 and the cap 26 are connected to each other in their central portions. In other words, the respective members excluding the insulating member 24 are electrically connected to each other.

An air hole (not illustrated) is formed in the lower valve body 23. Accordingly, when the inner pressure of the battery case is increased due to, for example, abnormal heat generation, the upper valve body 25 is expanded to the cap 26 side to be apart from the lower valve body 23. This disconnects the electrical connection between the lower valve body 23 and the upper valve body 25. When the inner pressure is further increased, the upper valve body 25 is broken, and gas is discharged from an opening (not illustrated) formed in the cap 26.

The electrode body 14 includes a positive electrode 11, the negative electrode 12, and a separator 13. The positive electrode 11 and the negative electrode 12 are spirally wound with the separator 13 interposed therebetween. However, the shape of the electrode body is not limited to this. The electrode body may include, for example, a disc-shaped positive electrode and a disc-shaped negative electrode or may be of a multilayer type in which multiple positive electrodes and multiple negative electrodes are alternately laminated with separators sandwiched therebetween. The disc-shaped positive electrode and negative electrode are applicable to the coin battery.

All the positive electrode 11, the negative electrode 12, and the separator 13 composing the electrode body 14 are formed into ships. In the electrode body 14, the positive electrode 11 and the negative electrode 12 are alternately laminated in the radial direction of the electrode body 14. In other words, the longitudinal direction of each electrode is the winding direction and the width direction of each electrode is the axis direction. Insulating plates 17 and 18 are respectively arranged in both end portions of the electrode body 14 in the axis direction.

As illustrated in FIG. 21, the positive electrode 11 includes a positive electrode current collector 30 and a positive electrode mixture layer 31. The positive electrode 11 is electrically connected to a positive electrode terminal of the cap 26 with a positive electrode lead 19. One end of the positive electrode lead 19 is connected to, for example, a portion near the center in the longitudinal direction of the positive electrode 11. The positive electrode lead 19 extending from the positive electrode 11 extends to the filter 22 through a through hole (not illustrated) formed in the insulating plate 17. The other end of the positive electrode lead 19 is welded to the face at the electrode body 14 side of the filter 22.

As illustrated in FIG. 21, the negative electrode 12 includes a negative electrode current collector 40. The negative electrode 12 is electrically connected to a negative electrode terminal of the case main body 15 with a negative electrode lead 20. One end of the negative electrode lead 20 is connected to, for example, the end portion in the longitudinal direction of the negative electrode 12. The other end of the negative electrode lead 20 is welded to, for example, the inner face of the bottom of the case main body 15.

INDUSTRIAL APPLICABILITY

The technology according to the present disclosure is applicable to the lithium secondary battery using the lithium metal as the negative electrode active material. The technology according to the present disclosure is applicable to, for example, the high-current charge in an electric vehicle. The technology is also, applicable to an electronic device, such as a mobile phone, a smartphone, or a tablet terminal. The technology is also applicable to a storage battery for home use. A combination of a solar battery and an automobile, such as a hybrid car or a plug-in hybrid car, may be used as the storage battery for home use.

While detailed embodiments have been used to illustrate the present invention, to those skilled in the art, however, it will be apparent from the foregoing disclosure that various changes and modifications can be made therein without departing from the spirit and scope of the invention. Furthermore, the foregoing description of the embodiments according to the present invention is provided for illustration only, and is not intended to limit the invention.

What is claimed is:

1. A control method comprising:
    determining whether an internal resistance of a secondary battery is higher than a first threshold resistance, wherein the secondary battery is a lithium secondary battery which includes a positive electrode and a negative electrode, wherein a negative electrode active material of the negative electrode is lithium metal, said lithium metal is configured to be substantially precipitated into the negative electrode during charge of the secondary battery;
    performing first discharge of the secondary battery if it is determined that the internal resistance is higher than the first threshold resistance; and
    performing at least one of a charge operation of the secondary battery and a discharge operation of the secondary battery after the first discharge is performed,
    wherein a capacity that is equal to or higher than 5% and not higher than 25% of a capacity of the positive electrode is discharged from the secondary battery through the first discharge.

2. The control method according to claim 1, the control method comprising:
    sequentially performing the first discharge of the secondary battery and first charge of the secondary battery if it is determined that the internal resistance is higher than the first threshold resistance; and
    performing at least one of second charge as the charge operation and second discharge as the discharge operation after the first discharge and the first charge are performed,
    wherein the second charge is charge with charge current larger than that of the first charge, and the second discharge is discharge with discharge current larger than that of the first discharge.

3. The control method according to claim 1,
    wherein the control method is performed using a control apparatus,
    wherein the control apparatus is configured so as to perform low-current charge of the secondary battery and high-current charge of the secondary battery in which the secondary battery is charged with charge current larger than that of the low-current charge, and
    wherein the control method includes
        determining whether the internal resistance is higher than a second threshold resistance after the first discharge is performed, wherein the second threshold resistance is either equal to or different from the first threshold resistance,
        performing the low-current charge as the charge operation if it is determined that the internal resistance is higher than the second threshold resistance, and
        performing the high-current charge as the charge operation if it is determined that the internal resistance is not higher than the second threshold resistance.

4. The control method according to claim 1,
    wherein the control method is performed using a control apparatus,
    wherein the control apparatus is configured so as to perform low-current discharge of the secondary battery and high-current discharge of the secondary battery in which discharge current larger than that of the low-current discharge is discharged from the secondary battery, and
    wherein the control method includes
        determining whether the internal resistance is higher than a second threshold resistance after the first discharge is performed, wherein the second threshold resistance is either equal to or different from the first threshold resistance,
        performing the low-current discharge as the discharge operation if it is determined that the internal resistance is higher than the second threshold resistance, and
        performing the high-current discharge as the discharge operation if it is determined that the internal resistance is not higher than the second threshold resistance.

5. The control method according to claim 1, the control method comprising:
    sequentially performing the first discharge of the secondary battery and first charge of the secondary battery if it is determined that the internal resistance is higher than the first threshold resistance;
    performing at least one of the charge operation and the discharge operation after the first discharge and the first charge are performed; and
    not performing the first discharge and the first charge and performing at least one of second charge of the secondary battery and second discharge of the secondary battery if it is determined that the internal resistance is not higher than the first threshold resistance,
    wherein the second charge is charge with charge current larger than that of the first charge, and the second discharge is discharge with discharge current larger than that of the first discharge.

6. The control method according to claim 1,
    wherein the control method is performed using a control apparatus,
    wherein the control apparatus is configured so as to perform low-current charge of the secondary battery and high-current charge of the secondary battery in which the secondary battery is charged with charge current larger than that of the low-current charge, and
    wherein the control method does not perform the first discharge and performs the high-current charge if it is determined that the internal resistance is not higher than the first threshold resistance.

7. The control method according to claim 1,
    wherein the control method is performed using a control apparatus,
    wherein the control apparatus is configured so as to perform low-current discharge of the secondary battery and high-current discharge of the secondary battery in which discharge current larger than that of the low-current discharge is discharged from the secondary battery, and
    wherein the control method does not perform the first discharge and performs the high-current discharge if it is determined that the internal resistance is not higher than the first threshold resistance.

8. The control method according to claim 1,
    wherein the first discharge is performed also if a temperature of the secondary battery is higher than a threshold temperature.

9. The control method according to claim 1,
    wherein a capacity of the lithium metal remaining on a surface of the negative electrode in a full discharge state of the secondary battery is 0% or more and 200% or less of a capacity of the positive electrode.

10. The control method according to claim 1, the control method comprising:
    sequentially performing the first discharge of the secondary battery and first charge of the secondary battery if it is determined that the internal resistance is higher than the first threshold resistance, wherein a capacity charged in the secondary battery through the first charge is higher than zero and lower than twice a capacity discharged from the secondary battery through the first discharge.

11. The control method according to claim 1, wherein, when the first discharge and the charge operation are performed, a capacity discharged from the secondary battery through the first discharge is lower than a capacity charged into the secondary battery in the charge operation, and wherein, when the first discharge and the discharge operation are performed, a capacity discharged from the secondary battery through the first discharge is lower than a capacity discharged from the secondary battery in the discharge operation.

12. A battery system comprising:

a secondary battery including a positive electrode and a negative electrode; and a control apparatus performing the control method according to claim 1.

13. The control method according to claim 1, wherein, if a calculated value of the internal resistance is higher than the first threshold resistance, it is determined that the internal resistance is higher than the first threshold resistance, wherein the calculated value is calculated from detection data about the secondary battery, and wherein the detection data includes at least one of a detection value of voltage of the secondary battery and a detection value of current of the secondary battery.

14. The control method according to claim 13, wherein the control method is performed using a control apparatus, wherein the control apparatus is configured so as to perform pulse energization, which is pulse discharge or pulse charge of the secondary battery, and wherein a closed circuit voltage, which is the voltage of the secondary battery during the pulse energization, the current of the secondary battery during the pulse energization, and an open circuit voltage, which is the voltage of the secondary battery during non-energization before the pulse energization is performed, are used for the calculation of the calculated value.

15. The control method according to claim 1, wherein the first discharge is performed also if a count time is longer than a threshold time, and wherein the count time is a duration from a last time when energization of the secondary battery is terminated or a time later than the last time when the energization of the secondary battery is terminated, and the last time when the energization of the secondary battery is terminated indicates the later time, among a last time when the discharge of the secondary battery is terminated and a last time when the charge of the secondary battery is terminated.

16. The control method according to claim 15, wherein the first discharge is performed also if a recording value that indicates the count time which should be recorded has been deleted from a recording unit.

17. A control method comprising:

determining whether an internal resistance of a secondary battery is higher than a first threshold resistance;

relieving or clearing a temporary increase in internal resistance of the secondary battery through first discharge of the secondary battery, wherein the secondary battery is a lithium secondary battery which includes a positive electrode and a negative electrode, wherein a negative electrode active material of the negative electrode is lithium metal, said lithium metal is configured to be substantially precipitated into the negative electrode during charge of the secondary battery; and performing at least one of a charge operation of the secondary battery and a discharge operation of the secondary battery after the first discharge is performed, wherein a capacity that is equal to or higher than 5% and not higher than 25% of a capacity of the positive electrode is discharged from the secondary battery through the first discharge.

18. A battery system comprising:

a secondary battery including a positive electrode and a negative electrode; and a control apparatus performing the control method according to claim 17.

* * * * *